US009633836B2

(12) United States Patent
Ahn et al.

(10) Patent No.: US 9,633,836 B2
(45) Date of Patent: Apr. 25, 2017

(54) METHODS OF FORMING SEMICONDUCTOR DEVICES INCLUDING LOW-K DIELECTRIC LAYER

(71) Applicant: Samsung Electronics Co., Ltd., Suwon-si (KR)

(72) Inventors: Sang-Hoon Ahn, Goyang-si (KR); Seung-Hyuk Choi, Songdo-dong (KR); Kyu-Hee Han, Hwaseong-si (KR)

(73) Assignee: Samsung Electronics Co., Ltd. (KR)

( * ) Notice: Subject to any disclaimer, the term of this patent is extended or adjusted under 35 U.S.C. 154(b) by 171 days.

(21) Appl. No.: 14/291,670

(22) Filed: May 30, 2014

(65) Prior Publication Data

US 2014/0370704 A1   Dec. 18, 2014

(30) Foreign Application Priority Data

Jun. 13, 2013 (KR) .................. 10-2013-0067948

(51) Int. Cl.
*H01L 21/02* (2006.01)
*H01L 21/768* (2006.01)
*H01L 23/48* (2006.01)
*H01L 23/522* (2006.01)
*H01L 23/532* (2006.01)

(52) U.S. Cl.
CPC .. *H01L 21/02203* (2013.01); *H01L 21/02126* (2013.01); *H01L 21/02208* (2013.01); *H01L 21/02274* (2013.01); *H01L 21/02348* (2013.01); *H01L 21/7682* (2013.01); *H01L 21/76898* (2013.01); *H01L 23/481* (2013.01); *H01L 23/5222* (2013.01); *H01L 23/53295* (2013.01); *H01L 2221/1047* (2013.01); *H01L 2924/0002* (2013.01)

(58) Field of Classification Search
CPC ......... H01L 21/02203; H01L 21/76802; H01L 21/02348; H01L 21/02208; H01L 21/02356; H01L 21/76877; H01L 21/02271; H01L 21/02126; H01L 21/02274; H01L 21/31695
USPC ........................................................ 438/666
See application file for complete search history.

(56) References Cited

U.S. PATENT DOCUMENTS

| 6,413,897 | B1 | 7/2002 | Randolph et al. |
| 6,589,644 | B1 | 7/2003 | Yamada et al. |
| 7,208,389 | B1 | 4/2007 | Tipton et al. |
| 7,265,061 | B1 * | 9/2007 | Cho .................. C23C 16/401 |
| | | | 257/E21.23 |

(Continued)

FOREIGN PATENT DOCUMENTS

| JP | 11-008236 | 1/1999 |
| JP | 11-008237 | 1/1999 |

(Continued)

*Primary Examiner* — Joseph C Nicely
(74) *Attorney, Agent, or Firm* — Myers Bigel, P.A.

(57) ABSTRACT

Methods of forming a dielectric layer are provided. The methods may include introducing oxygen radicals and organic silicon precursors into a chamber to form a preliminary dielectric layer on a substrate. Each of the organic silicon precursors may include a carbon bridge and a porogen such that the preliminary dielectric layer may include carbon bridges and porogens. The methods may also include removing at least some of the porogens from the preliminary dielectric layer to form a porous dielectric layer including the carbon bridges.

16 Claims, 17 Drawing Sheets

(56) References Cited

U.S. PATENT DOCUMENTS

| | | | |
|---|---|---|---|
| 7,297,376 B1 | 11/2007 | Yim et al. | |
| 7,491,658 B2 * | 2/2009 | Nguyen | C23C 16/401 257/E21.273 |
| 7,563,706 B2 | 7/2009 | Nakagawa et al. | |
| 7,582,555 B1 | 9/2009 | Lang et al. | |
| 7,629,227 B1 | 12/2009 | Wang et al. | |
| 7,670,961 B2 | 3/2010 | Sachdev et al. | |
| 7,709,063 B2 * | 5/2010 | Yuda | C23C 16/402 118/723 E |
| 7,915,139 B1 | 3/2011 | Lang et al. | |
| 7,989,033 B2 * | 8/2011 | Yim | C23C 16/401 427/248.1 |
| 2005/0194619 A1 * | 9/2005 | Edelstein | H01L 31/103 257/232 |
| 2007/0110918 A1 * | 5/2007 | Yuda | C23C 16/402 427/561 |
| 2008/0220619 A1 * | 9/2008 | Matsushita et al. | 438/795 |
| 2009/0075472 A1 * | 3/2009 | Arnold | H01L 21/02063 438/623 |
| 2009/0093134 A1 | 4/2009 | Matsushita et al. | |
| 2009/0093135 A1 | 4/2009 | Matsushita et al. | |
| 2009/0125282 A1 | 5/2009 | Takahashi et al. | |
| 2011/0111137 A1 | 5/2011 | Liang et al. | |
| 2011/0129616 A1 | 6/2011 | Ingle et al. | |
| 2011/0151678 A1 | 6/2011 | Ashtiani et al. | |
| 2011/0250731 A1 * | 10/2011 | Kweskin | H01L 21/76229 438/400 |
| 2011/0308937 A1 * | 12/2011 | Haas | C23C 16/401 204/192.15 |
| 2012/0178253 A1 * | 7/2012 | Ahn | C23C 16/401 438/643 |
| 2013/0043514 A1 * | 2/2013 | Grill | H01L 21/02126 257/288 |
| 2013/0175680 A1 * | 7/2013 | Gates et al. | 257/734 |
| 2013/0214383 A1 * | 8/2013 | Nakamoto | H01L 21/02126 257/506 |
| 2014/0235069 A1 * | 8/2014 | Breiling et al. | 438/778 |
| 2014/0242808 A1 * | 8/2014 | Akiyama et al. | 438/763 |
| 2014/0287598 A1 * | 9/2014 | Hirose | H01L 21/02164 438/787 |
| 2014/0356549 A1 * | 12/2014 | Varadarajan | C23C 16/325 427/568 |

FOREIGN PATENT DOCUMENTS

| | | |
|---|---|---|
| JP | 2009-088281 | 4/2009 |
| KR | 1020020083574 | 11/2002 |
| KR | 1020070072868 | 7/2007 |

* cited by examiner (a)          (b)

METHODS OF FORMING SEMICONDUCTOR DEVICES INCLUDING LOW-K DIELECTRIC LAYER

CROSS-REFERENCE TO RELATED APPLICATION

This U.S. non-provisional application claims priority under 35 U.S.C. §119 to Korean Patent Application No. 10-2013-0067948, filed on Jun. 13, 2013, in the Korean Intellectual Property Office, the disclosure of which is hereby incorporated by reference in its entirety.

FIELD

The present disclosure generally relates to the field of electronics, and more particularly, to semiconductor devices.

BACKGROUND

Porous low-k dielectric layers have been developed in response to a growing need for lower dielectric constant layers. However, the porous low-k dielectric layers do not have enough mechanical strength against stress applied during semiconductor device manufacturing processes, and thus, it is difficult to use the porous low-k dielectric layers in semiconductor devices.

SUMMARY

A method of forming a semiconductor device may include introducing a plasma and organic silicon precursors into a chamber to form a preliminary dielectric layer on a wafer. The plasma may include oxygen radicals generated from an external plasma generator that is outside the chamber, the organic silicon precursors may include carbon bridges and porogens, and the preliminary dielectric layer may include the porogens. The method may also include forming a porous dielectric layer by removing at least some of the porogens from the preliminary dielectric layer.

According to various embodiments, the external plasma generator may include a microwave generator configured to generate microwaves and a gas supply configured to supply a gas including oxygen, and the plasma may be generated by passing the gas including oxygen through the microwaves generated from the microwave generator. The gas including oxygen may be $O_2$, $N_2O$, $H_2O$ or combinations thereof.

According to various embodiments, the organic silicon precursors may include a compound represented by the following chemical formula:

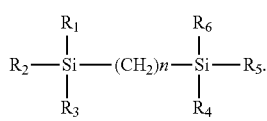

Each of $R_1$, $R_2$, $R_3$, $R_4$, $R_5$ and $R_6$ may be one of hydrogen, alkyl, and alkoxy, n may be an integer of 1 to 5, and at least one of $R_1$, $R_2$, $R_3$, $R_4$, $R_5$ and $R_6$ may include one of the porogens.

According to various embodiments, the organic silicon precursors may include a compound represented by the following chemical formula:

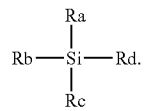

Each of Ra, Rb, Rc, and Rd may be one of hydrogen, alkyl, and alkoxy, and at least one of Ra, Rb, Rc, and Rd may include one of the porogens.

In various embodiments, the porogens may include a —CHx-CHy- bonding structure.

In various embodiments, the organic silicon precursors may be combined with a carrier gas to be introduced into the chamber. The organic silicon precursors may be supplied at a flow rate of about 50 milligrams per minute (mg/min) to about 500 mg/min. The carrier gas may include an inert gas and may be supplied at a flow rate of about 500 standard-cubic-centimeters per minute (sccm) to about 3,000 sccm.

According to various embodiments, the method may further include loading the wafer onto a mounter in the chamber and controlling a temperature of the mounter at a range of about −25° C. to about 100° C.

According to various embodiments, the method may further include maintaining an internal pressure of the chamber at a range of about 0.9 Torr to about 5 Torr.

In various embodiments, removing the porogens may include irradiating UV light.

In various embodiments, the oxygen radicals may be introduced from an upper portion of the chamber, and the organic silicon precursors may be introduced through a tubular nozzle protruding from a side of the chamber.

A method of forming a semiconductor device may include forming a via hole in a lower layer formed on a substrate, forming a preliminary via dielectric layer including porogens on an upper surface of the lower layer and an inner wall of the via hole, converting the preliminary via dielectric layer into a porous via dielectric layer by performing a curing process to remove the porogens, and forming a via plug filling the via hole on the porous via dielectric layer. Forming the preliminary via dielectric layer may include introducing oxygen plasma generated outside a chamber and organic silicon precursors including carbon bridges and the porogens into the chamber.

According to various embodiments, the method may also include forming a transistor on the substrate and forming a lower interlayer dielectric layer covering the transistor on the substrate. The lower layer may include the lower interlayer dielectric layer and the via hole may vertically pass through the lower interlayer dielectric layer and the substrate.

A method of forming a dielectric layer may include introducing oxygen radicals and organic silicon precursors into a chamber to form a preliminary dielectric layer on a substrate. Each of the organic silicon precursors may include a carbon bridge and a porogen such that the preliminary dielectric layer includes carbon bridges and porogens. The method may also include removing at least some of the porogens from the preliminary dielectric layer to form a porous dielectric layer including the carbon bridges.

According to various embodiments, the oxygen radicals may be generated outside the chamber.

In various embodiments, the organic silicon precursors may include a compound having the following structure:

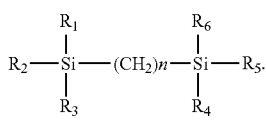

Each of $R_1$, $R_2$, $R_3$, $R_4$, $R_5$ and $R_6$ may be one of hydrogen, alkyl, and alkoxy, n may be an integer of 1 to 5, and at least one of $R_1$, $R_2$, $R_3$, $R_4$, $R_5$ and $R_6$ may include one of the porogens.

In various embodiments, the organic silicon precursors may include a compound having the following structure:

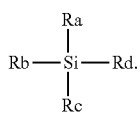

Each of Ra, Rb, Rc, and Rd may be one of hydrogen, alkyl, and alkoxy, and at least one of Ra, Rb, Rc, and Rd may include one of the porogens.

According to various embodiments, removing at least some of the porogens may include irradiating UV light.

DETAILED DESCRIPTION

Figure 1A:
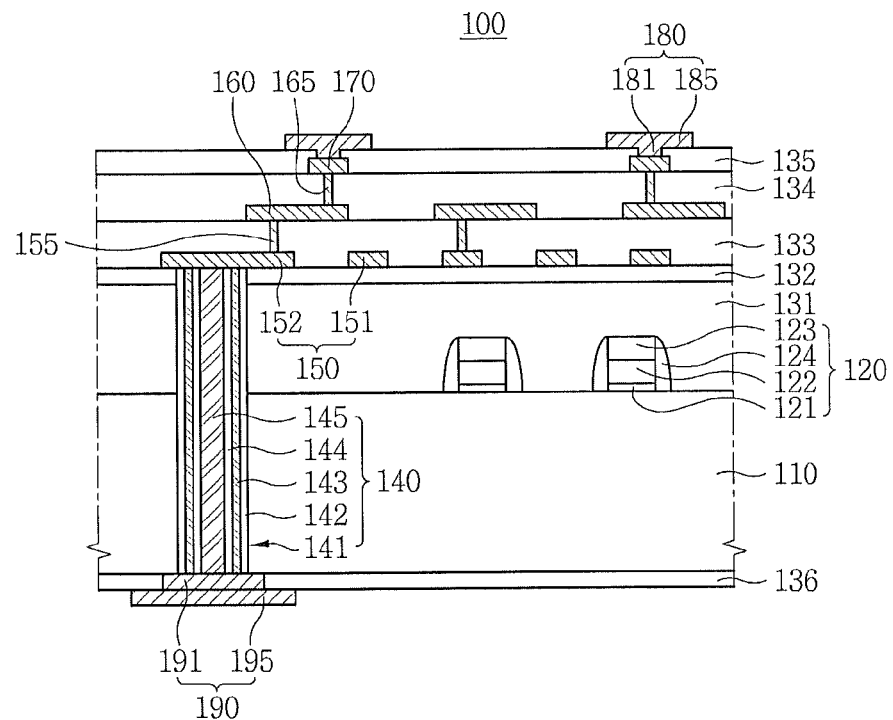
FIGS. 1A and 1B are cross-sectional views illustrating semiconductor devices according to some embodiments of the present inventive concept.

Various embodiments are described below with reference to the accompanying drawings. These inventive concepts may, however, be embodied in different forms without deviating from the spirit and teachings of this disclosure and so the disclosure should not be construed as limited to example embodiments set forth herein. Rather, these embodiments are provided so that this disclosure will be thorough and complete and will fully convey the scope of the disclosure to those skilled in the art. In the drawings, the sizes and relative sizes of layers and regions may be exaggerated for clarity. Like reference numbers refer to like elements throughout.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements. Other words used to describe relationships between elements should be interpreted in a like fashion (i.e., "between" versus "directly between," "adjacent" versus "directly adjacent," etc.).

It will be understood that, although the terms first, second, A, B, etc. may be used herein to describe elements of the invention, such elements should not be construed as limited by these terms. For example, a first element could be termed a second element, and a second element could be termed a first element, without departing from the teachings of the present embodiments. Herein, the term "and/or" includes any and all combinations of one or more referents.

Spatially relative terms, such as "beneath," "below," "lower," "above," "upper" and the like, may be used herein for ease of description to describe one element's or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein may be interpreted accordingly.

The terminology used herein is for the purpose of describing particular embodiments only and is not intended to be limiting of the embodiments. As used herein, the singular forms "a," "an," and "the" are intended to include the plural forms as well, unless the context clearly indicates otherwise. In other words, elements of the invention referred to in the singular may number one or more, unless the context clearly indicates otherwise. It will be further understood that the terms "comprises," "comprising," "includes," and/or "including," when used herein, specify the presence of stated features, items, steps, operations, elements, and/or components, but do not preclude the presence or addition of one or more other features, items, steps, operations, elements, components, and/or groups thereof.

Embodiments are described herein with reference to cross-sectional illustrations that are schematic illustrations of idealized embodiments (and intermediate structures). As such, variations from the shapes of the illustrations as a result, for example, of manufacturing techniques and/or tolerances, are to be expected. Thus, embodiments should not be construed as limited to the particular shapes of regions illustrated herein but are to include deviations in shapes that result, for example, from manufacturing. Thus, the regions illustrated in the figures are schematic in nature and their shapes are not intended to illustrate the actual shape of a region of a device and are not intended to limit the scope of the present inventive concept.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and this specification and will not be interpreted in an idealized or overly formal sense unless expressly so defined herein.

Figure 1B:
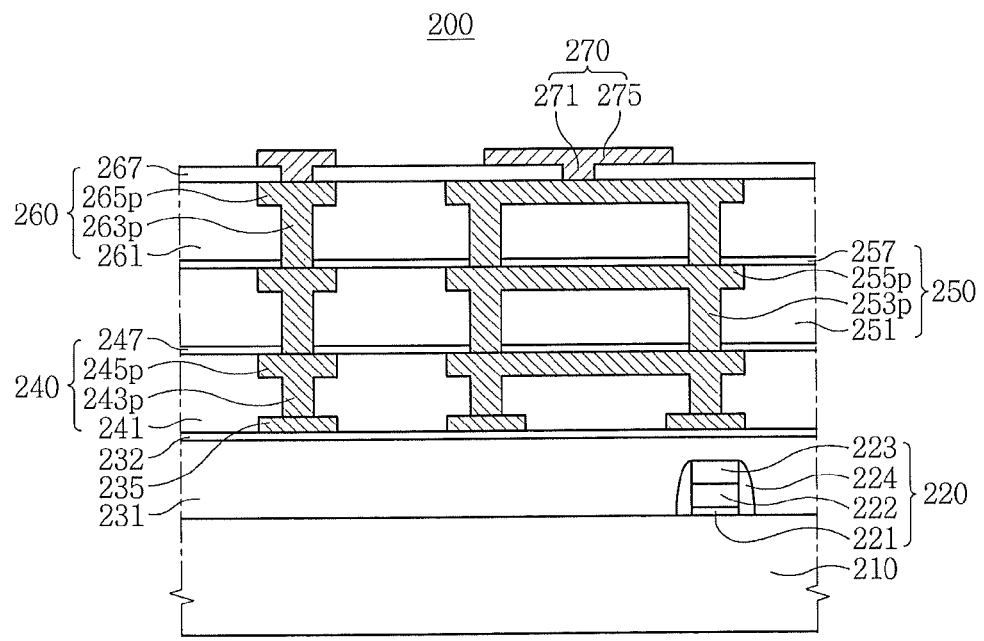

FIGS. 1A and 1B are cross-sectional views illustrating semiconductor devices according to some embodiments of the present inventive concept. Referring to FIG. 1A, a semiconductor device 100 in accordance with some embodiments of the present inventive concept may include a substrate 110 having an upper surface and a lower surface, a transistor 120, interlayer dielectric layers 131, 133, and 134, metal layers 150, 160, and 170 disposed on the upper surface of the substrate 110, and a via plug structure 140 formed in the substrate 110. The semiconductor device 100 may further include an upper chip pad 180 disposed above the upper surface of the substrate 110, and a lower surface redistribution layer 190 formed on the lower surface of the substrate 110.

The substrate 110 may include a semiconductor wafer having a single crystalline silicon bulk wafer or an epitaxially grown layer. The transistor 120 may include a gate dielectric layer 121, a gate electrode 122, a gate capping layer 123, and a gate spacer 124. The gate dielectric layer 121 directly formed on the substrate 110 may include silicon oxide or a metal oxide. The gate electrode 122 disposed on the gate dielectric layer 121 may include polysilicon, a metal silicide, a metal, a metal alloy, a metal compound, or a combination thereof. The gate capping layer 123 may be formed on the gate electrode 122. The gate spacer 124 may be formed on sidewalls of the gate dielectric layer 121, the gate electrode 122, and the gate capping layer 123. The gate capping layer 123 and the gate spacer 124 may include a dielectric material, such as silicon nitride and silicon oxynitride, that is harder than silicon oxide.

A lower interlayer dielectric layer 131 covering the upper surface of the substrate 110 and the transistors 120 may be formed. The lower interlayer dielectric layer 131 may include silicon oxide. The lower interlayer dielectric layer 131 may include a porous low-k dielectric. A lower stopper layer 132 may be formed on the lower interlayer dielectric layer 131. The lower stopper layer 132 may include silicon nitride.

The via plug structure 140 may vertically penetrate or pass through the lower stopper layer 132, the lower interlayer dielectric layer 131, and the substrate 110. The via plug structure 140 may include a via hole 141, a via dielectric layer 142 conformally formed on an inner wall of the via hole 141, a via barrier layer 143 conformally formed on the via dielectric layer 142, a via seed layer 144 conformally formed on the via barrier layer 143, and a via plug 145 formed on the via seed layer 144 to fill the via hole 141. The via dielectric layer 142 may include silicon oxide. In some embodiments, the via dielectric layer 142 may include a porous low-k dielectric. The via barrier layer 143 may include a barrier metal, such as Ti, TiN, Ta, TaN, TiW, and WN. The via seed layer 144 may include a single metal or alloy including Cu, W, TiW, Ni, etc. The via plug 145 may include a metal such as Cu. When the via seed layer 144 and the via plug 145 include the same metal, a boundary therebetween may be less visible.

The lower metal layer 150 may be formed on the via plug structure 140 and/or the lower stopper layer 132. The lower metal layer 150 may include a lower metal interconnection 151 and a via plug pad 152. The via plug pad 152 may be electrically connected to and in direct contact with the via plug structure 140.

An intermediate interlayer dielectric layer 133 covering the lower metal layer 150 may be formed on lower stopper layer 132. The intermediate interlayer dielectric layer 133 may include silicon oxide. In some embodiments, the intermediate interlayer dielectric layer 133 may include a porous low-k dielectric.

An intermediate metal layer 160 may be formed on the intermediate interlayer dielectric layer 133. A lower inner via plug 155 vertically passing through the intermediate interlayer dielectric layer 133 and electrically connecting the via plug pad 152 to the intermediate metal layer 160 may be formed.

An upper interlayer dielectric layer 134 covering the intermediate metal layer 160 may be formed on the intermediate interlayer dielectric layer 133. The upper interlayer dielectric layer 134 may include silicon oxide. In some embodiments, the upper interlayer dielectric layer 134 may include a porous low-k dielectric.

An upper metal layer 170 may be formed on the upper interlayer dielectric layer 134. An upper inner via plug 165 vertically passing through the upper interlayer dielectric layer 134 and electrically connecting the intermediate metal layer 160 to the upper metal layer 170 may be formed.

A passivation layer 135 covering the upper metal layer 170 may be formed on the upper interlayer dielectric layer 134. The passivation layer 135 may include silicon nitride, silicon oxide, or a polyimide.

The upper chip pad 180 may be formed on the passivation layer 135. The upper chip pad 180 may include a plug part 181 passing through the passivation layer 135 to be connected to the upper metal layer 170, and a pad part 185 disposed on the passivation layer 135. The upper chip pad 180 may include a metal.

A lower surface dielectric layer 136 may be formed on the lower surface of the substrate 110. The lower surface dielectric layer 136 may include silicon nitride, silicon oxide, or a polyimide. The via plug structure 140 may be exposed on the lower surface of the substrate 110.

The lower surface redistribution layer 190 may be formed on the exposed via plug structure 140. The lower surface redistribution layer 190 may include a plug part 191 passing through the lower surface dielectric layer 136 to be electrically connected to the via plug structure 140, and a pad part 195 disposed on the lower surface dielectric layer 136.

The semiconductor device 100 according to some embodiments of the present inventive concept may include at least one porous low-k dielectric. Accordingly, the capacitance between conductive materials and RC delay may be decreased and thus electrical signals may be more stably transferred at very high speed.

Referring to FIG. 1B, a semiconductor device 200 according to some embodiments of the present inventive concept may include a substrate 210, a transistor 220 disposed on the substrate 210, a lower interlayer dielectric layer 231 covering the transistor 220, a first interconnection structure 240 disposed on the lower interlayer dielectric layer 231, a second interconnection structure 250 disposed on the first interconnection structure 240, a third interconnection structure 260 disposed on the second interconnection structure 250, and a redistribution layer structure 270 disposed on the third interconnection structure 260.

The substrate 210 may include a semiconductor wafer having a single crystalline silicon bulk or epitaxially grown layer. The transistor 220 may include a gate dielectric layer 221, a gate electrode 222, a gate capping layer 223, and a gate spacer 224. The gate dielectric layer 221 directly formed on the substrate 210 may include silicon oxide or a metal oxide. The gate electrode 222 disposed on the gate dielectric layer 221 may include polysilicon, a metal silicide, a metal, an alloy, a metal compound, or a combination thereof. The gate capping layer 223 may be formed on the gate electrode 222. The gate spacer 224 may be formed on sidewalls of the gate dielectric layer 221, the gate electrode 222, and the gate capping layer 223. The gate capping layer 223 and the gate spacer 224 may include a dielectric material, such as silicon nitride and silicon oxynitride, that is harder than silicon oxide.

The lower interlayer dielectric layer 231 may include silicon oxide. In some embodiments, the lower interlayer dielectric layer 231 may include a porous low-k dielectric. The semiconductor device 200 may further include a lower stopper layer 232 covering the lower interlayer dielectric layer 231. The lower stopper layer 232 may include silicon nitride. A lower metal layer 235 may be formed on the lower stopper layer 232.

The first interconnection structure 240 may include a first intermediate interlayer dielectric layer 241 covering the lower metal layer 235, a first via plug 243p and first interconnection plug 245p passing through the first intermediate interlayer dielectric layer 241 to be connected to the lower metal layer 235, and a first intermediate stopper layer 247 covering the first intermediate interlayer dielectric layer 241 and the first interconnection plug 245p.

The first intermediate interlayer dielectric layer 241 may include silicon oxide. In some embodiments, the first intermediate interlayer dielectric layer 241 may include a porous low-k dielectric. The first intermediate stopper layer 247 may include silicon nitride.

The second interconnection structure 250 may include a second intermediate interlayer dielectric layer 251 covering the first interconnection plug 245p, a second via plug 253p and second interconnection plug 255p passing through the second intermediate interlayer dielectric layer 251 to be connected to the first interconnection plug 245p, and a second intermediate stopper layer 257 covering the second intermediate interlayer dielectric layer 251 and the second interconnection plug 255p.

The second intermediate interlayer dielectric layer 251 may include silicon oxide. In some embodiments, the second intermediate interlayer dielectric layer 251 may include a porous low-k dielectric. The second intermediate stopper layer 257 may include silicon nitride.

The third interconnection structure 260 may include a third intermediate interlayer dielectric layer 261 covering the second interconnection plug 255p, a third via plug 263p and third interconnection plug 265p passing through the third intermediate interlayer dielectric layer 261 to be connected to the second interconnection plug 255p, and a passivation layer 267 covering the third intermediate interlayer dielectric layer 261 and the third interconnection plug 265p.

The third intermediate interlayer dielectric layer 261 may include silicon oxide. In some embodiment, the third intermediate interlayer dielectric layer 261 may include a porous low-k dielectric. The passivation layer 267 may include silicon nitride, silicon oxide, or a polyimide.

The redistribution layer structure 270 may include a plug part 271 vertically passing through the passivation layer 267 to be electrically connected to the third interconnection plug 265p, and a pad part 275 disposed on the passivation layer 267. The redistribution layer structure 270 may include a metal.

The semiconductor device 200 according to some embodiments of the present inventive concept may include at least one porous low-k dielectric. Accordingly, the capacitance between the conductive materials and RC delay may decrease and thus electrical signals may be stably transferred at high speed.

Figure 2A:
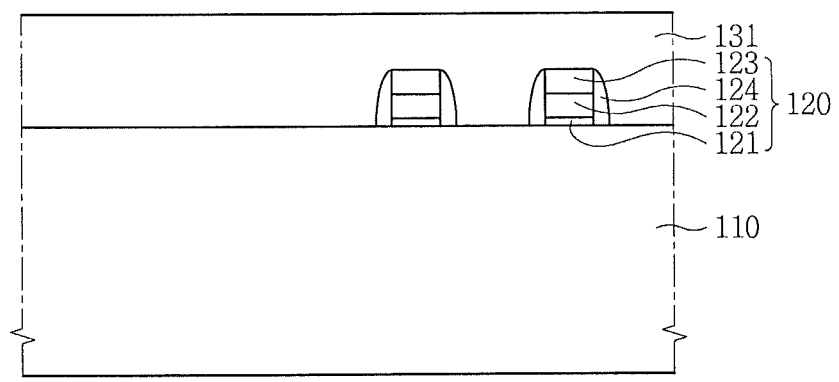
FIGS. 2A to 2K are cross-sectional views illustrating a method of forming a semiconductor device according to some embodiments of the present inventive concept.

FIGS. 2A to 2K are cross-sectional views illustrating a method of forming a semiconductor device according to some embodiments of the present inventive concept. Referring to FIG. 2A, a method of forming a semiconductor device according to some embodiments of the present inventive concept may include forming transistors 120 on a substrate 110, and forming a lower interlayer dielectric layer 131 covering the substrate 110 and the transistors 120. The substrate 110 may include a semiconductor wafer having a single crystalline silicon bulk or epitaxially grown layer. Each of the transistors 120 may include a gate dielectric layer 121, a gate electrode 122, a gate capping layer 123, and a gate spacer 124. The gate dielectric layer 121 may include silicon oxide or a metal oxide. The gate electrode 122 may include polysilicon, a metal silicide, a metal, an alloy, a metal compound, or a combination thereof. The gate capping layer 123 and the gate spacer 124 may include a dielectric material, such as silicon nitride or silicon oxynitride, that is harder than silicon oxide. The formation of the lower interlayer dielectric layer 131 may include depositing silicon oxide using, for example, a chemical vapor deposition (CVD) process. The method of forming the lower interlayer dielectric layer 131 will be described herein in detail.

Figure 2B:
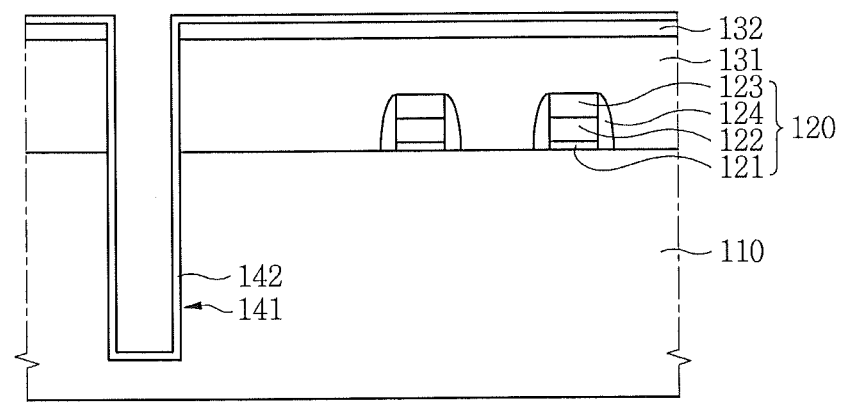

Referring to FIG. 2B, the method may include forming a via hole 141, and forming a via dielectric layer 142 on an inner wall of the via hole 141. For example, the method may include forming an etch mask and/or, a lower stopper layer 132 on the lower interlayer dielectric layer 131, forming the via hole 141 vertically passing through the lower interlayer dielectric layer 131 in the substrate 110 using an etch process, and conformally forming the via dielectric layer 142 on the inner wall of the via hole 141. The method of forming the via dielectric layer 142 will be described herein in detail.

Figure 2C:
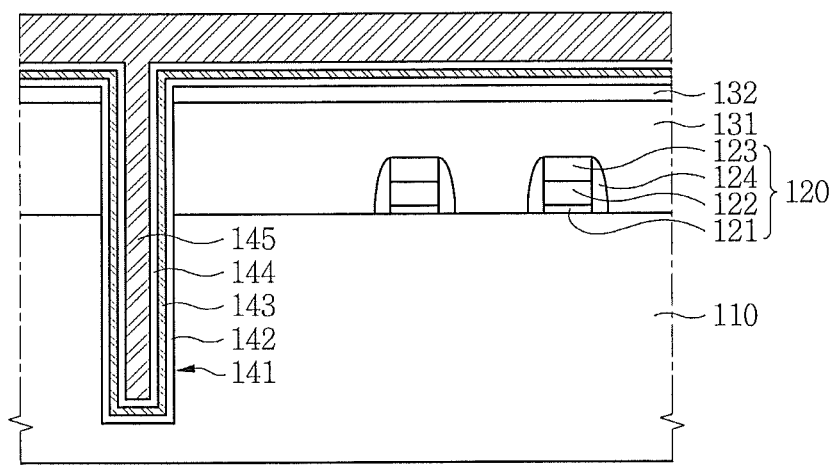

Referring to FIG. 2C, the method may include forming a via barrier layer 143 and a via seed layer 144 on the via dielectric layer 142 disposed on the inner wall of the via hole 141, and forming a via plug 145 filling the via hole 141 on the via seed layer 144. The via barrier layer 143 may be formed using a CVD process. The via barrier layer 143 may include a barrier metal, such as Ti, TiN, Ta, TaN, TiW, and WN. The via seed layer 144 may be formed using a physical vapor deposition (PVD) process such as sputtering, or a CVD process. The via seed layer 144 may include a single metal or alloy including Cu, W, TiW, Ni, etc. The via plug 145 may be formed using an electroplating process. The via plug 145 may include a metal such as Cu. When the via seed layer 144 and the via plug 145 include the same metal, a boundary therebetween may be less visible.

Figure 2D:
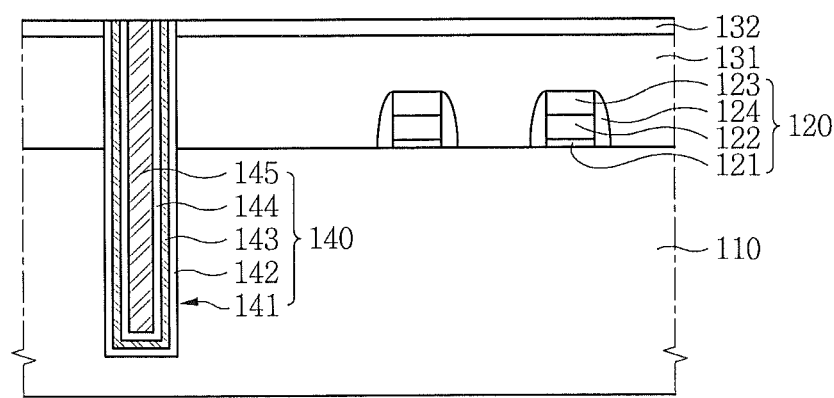

Referring to FIG. 2D, the method may include forming a via plug structure 140 by planarizing the via plug 145, the via seed layer 144, the via barrier layer 143, and the via dielectric layer 142. The planarization process may include a chemical mechanical polishing (CMP) process.

Figure 2E:
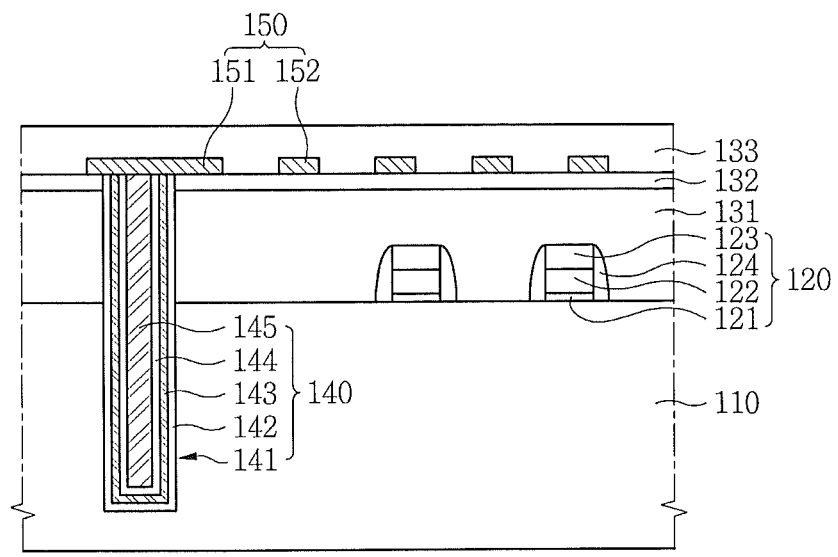

Referring to FIG. 2E, the method may include forming a lower metal layer 150 and an intermediate interlayer dielectric layer 133 covering the lower metal layer 150 on the lower interlayer dielectric layer 131 or the lower stopper layer 132. The lower metal layer 150 may include a lower metal interconnection 151 and a via plug pad 152 connected to the via plug structure 140.

Figure 2F:
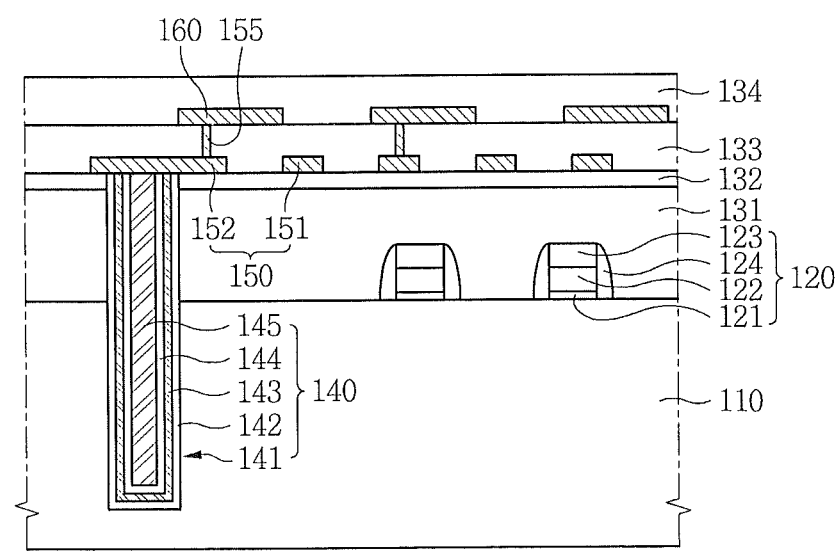

Referring to FIG. 2F, the method may include forming lower inner via plugs 155 passing through the intermediate interlayer dielectric layer 133, an intermediate metal layer 160, and an upper interlayer dielectric layer 134 covering the intermediate metal layer 160. At least one of the lower inner via plugs 155 may be electrically connected to the via plug pad 152. The intermediate metal layer 160 may include a metal interconnection.

Figure 2G:
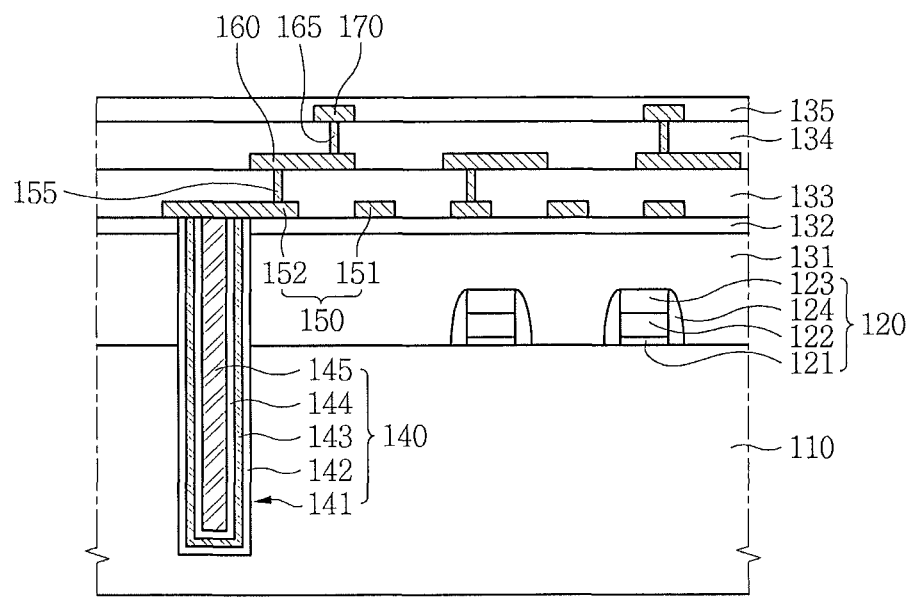

Referring to FIG. 2G, the method may include forming an upper inner via plugs 165 passing through the upper interlayer dielectric layer 134, an upper metal layer 170, and a passivation layer 135 covering the upper metal layer 170. At least one of the upper inner via plugs 165 may be electrically connected to the via plug pad 152. The upper metal layer 170 may include a metal interconnection. The passivation layer 135 may include silicon nitride and/or silicon oxide.

Figure 2H:
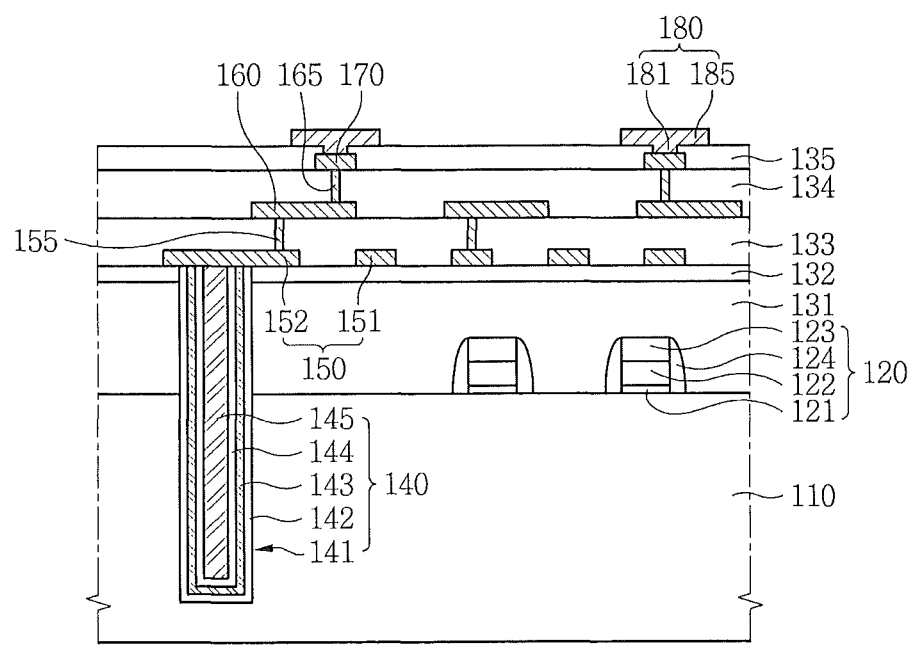

Referring to FIG. 2H, the method may include forming an upper chip pads 180 passing through the passivation layer 135 to be connected to the upper metal layer 170. Each of the upper chip pads 180 may include a plug part 181 passing through the passivation layer 135, and a pad part 185 disposed on the passivation layer 135. The upper chip pads 180 may be formed using a process of forming a redistribution layer.

Figure 2I:
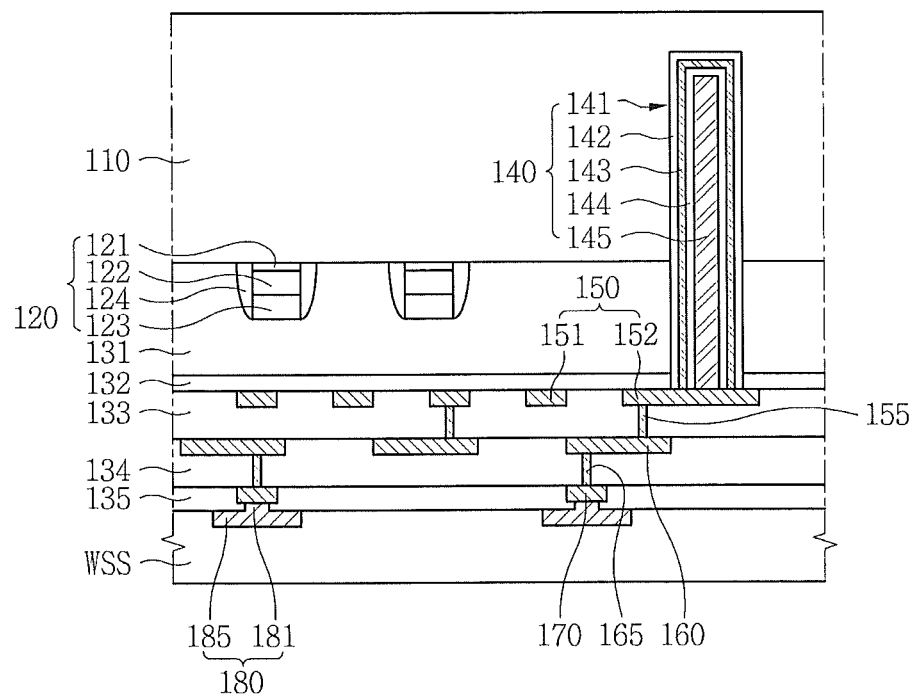

Referring to FIG. 2I, the method may include attaching a wafer support carrier (WSC) to the upper chip pads 180, and turning over the substrate 110.

Figure 2J:
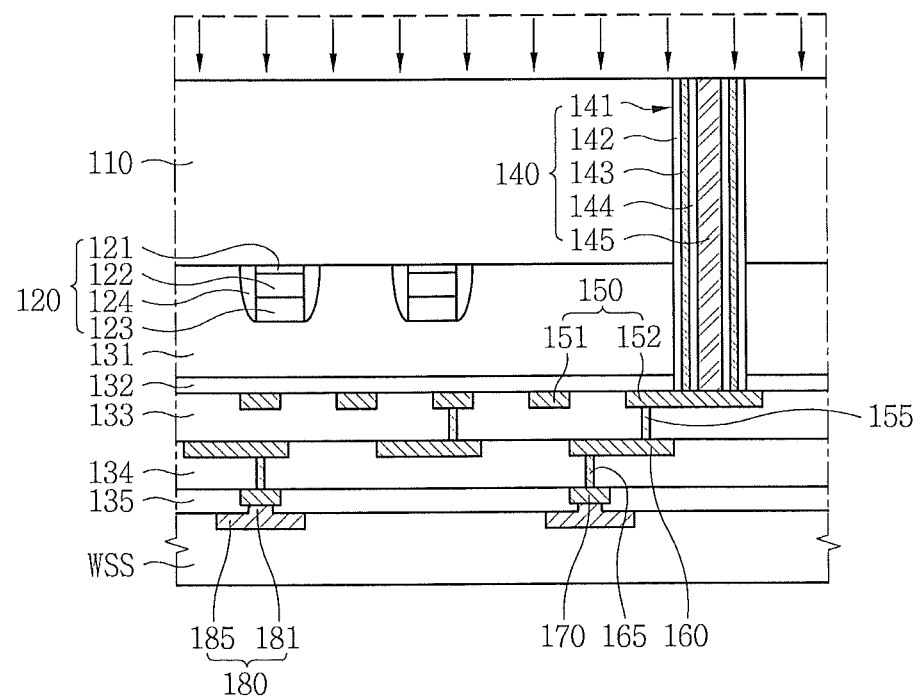

Referring to FIG. 2J, the method may include etching a lower surface of the substrate 110 to expose an ending part of the via plug structure 140. The exposed ending part of the via plug structure 140 may include the via barrier layer 143 covering the via plug 145.

Figure 2K:
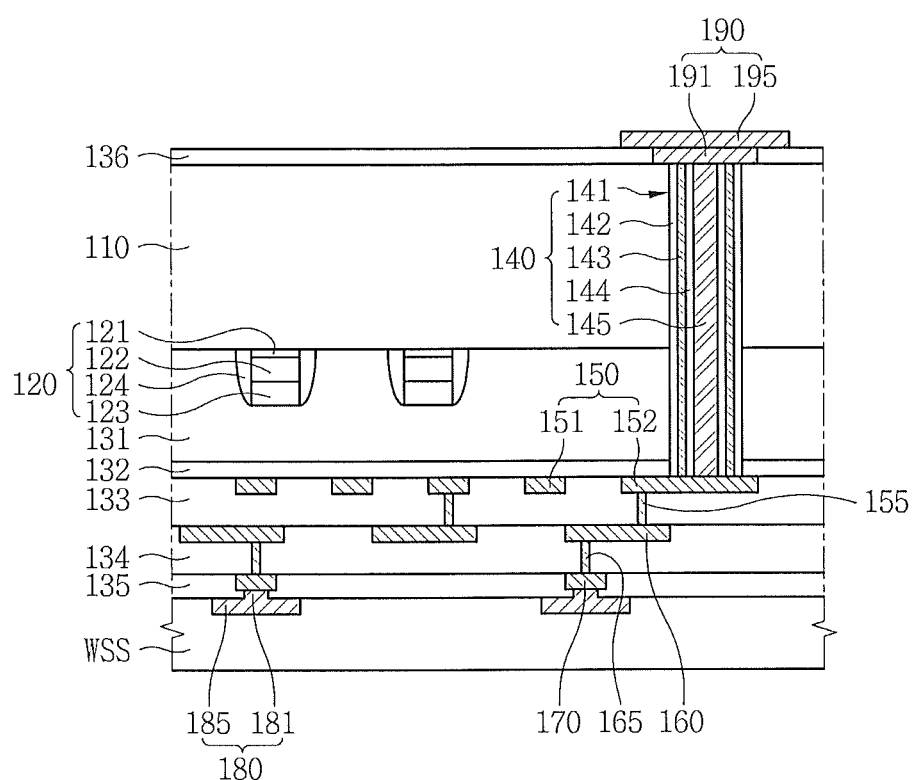

Referring to FIG. 2K, the method may include forming a lower surface dielectric layer 136 and a lower surface redistribution layer 190 on the lower surface of the substrate 110. The lower surface dielectric layer 136 may include silicon oxide and/or silicon nitride. The lower surface redistribution layer 190 may be formed using a redistribution layer formation process. The lower surface redistribution layer 190 may include a metal. The lower surface redistribution layer 190 may include a plug part 191 passing through the lower surface dielectric layer 136 and a pad part 195 disposed on the lower surface dielectric layer 136.

Referring to FIG. 1A again, the WSC may be removed and the semiconductor device 100 according to some embodiments of the present inventive concept may be manufactured.

Figure 3A:
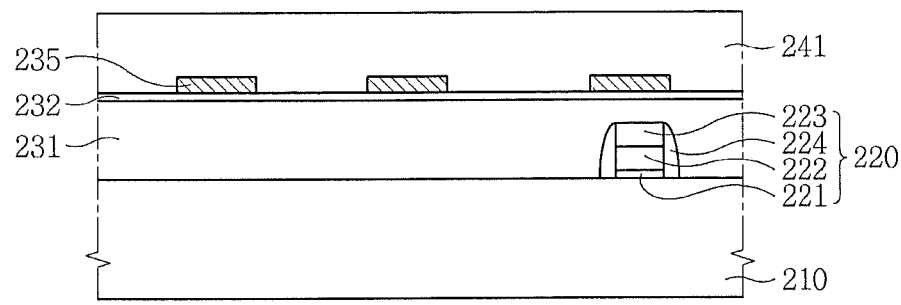
FIGS. 3A to 3G are cross-sectional views illustrating a method of forming a semiconductor device according to some embodiments of the present inventive concept.

FIGS. 3A to 3G are cross-sectional views illustrating a method of forming a semiconductor device according to some embodiments of the present inventive concept. Referring to FIG. 3A, a method of forming a semiconductor device according to some embodiments of the present inventive concept may include forming a transistor 220, a lower interlayer dielectric layer 231, a lower stopper layer 232, a lower metal layer 235, and a first intermediate interlayer dielectric layer 241 on a substrate 210. The substrate 210 may include a semiconductor wafer having a single crystalline silicon bulk or epitaxially grown layer. The transistor 220 may include a gate dielectric layer 221, a gate electrode 222, a gate capping layer 223, and a gate spacer 224. The gate dielectric layer 221 may include silicon oxide or a metal oxide. The gate electrode 222 may include polysilicon, a metal silicide, a metal, an alloy, a metal compound, or a combination thereof. The gate capping layer 223 and the gate spacer 224 may include a dielectric material, such as silicon nitride and silicon oxynitride, that is harder than silicon oxide. The formation of the lower interlayer dielectric layer 231 and the first intermediate interlayer dielectric layer 241 may include depositing silicon oxide using, for example, a CVD process. The method of forming the lower interlayer dielectric layer 231 and the first intermediate interlayer dielectric layer 241 will be described herein in detail. The lower metal layer 235 may include a metal interconnection.

Figure 3B:
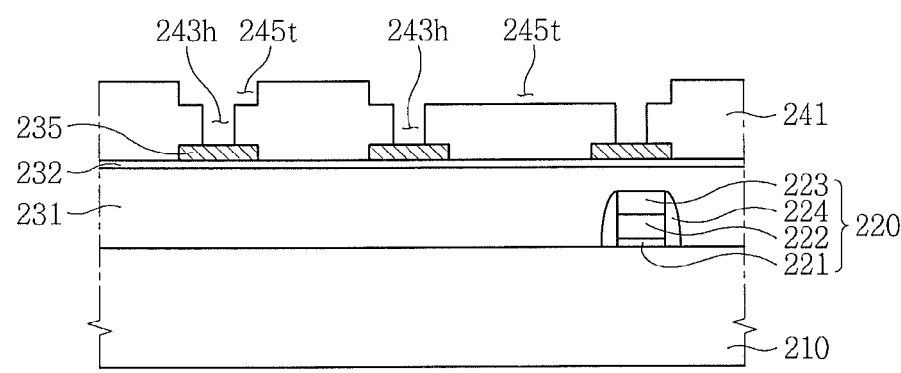

Referring to FIG. 3B, the method may include forming first via holes 243h and first interconnection trenches 245t in the first intermediate interlayer dielectric layer 241. The first via holes 243h may expose at least a portion of a surface of the lower metal layer 235. The first interconnection trenches 245t may overlap at least one of the first via holes 243h.

Figure 3C:
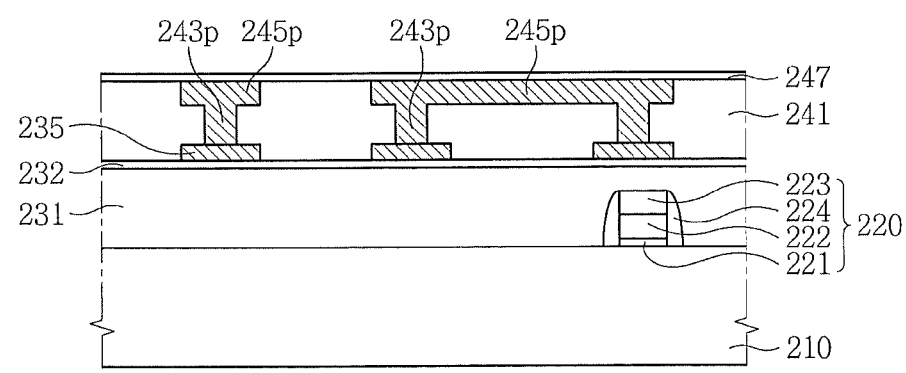

Referring to FIG. 3C, the method may include forming first via plugs 243p, first interconnection plugs 245p, and a first intermediate stopper layer 247. The first via plugs 243p may fill the first via holes 243h, and the first interconnection plugs 245p may fill the first interconnection trenches 245t. The first via plugs 243p and the first interconnection plugs 245p may be formed using a dual damascene process. Each of the first via plugs 243p and the first interconnection plugs 245p may include a barrier metal or a core metal. The barrier metal may include a metal for barrier, such as Ti, TiN, Ta, TaN, TiW, and WN. The core metal may include a metal such as Cu and W. The first intermediate stopper layer 247 may include silicon nitride.

Figure 3D:
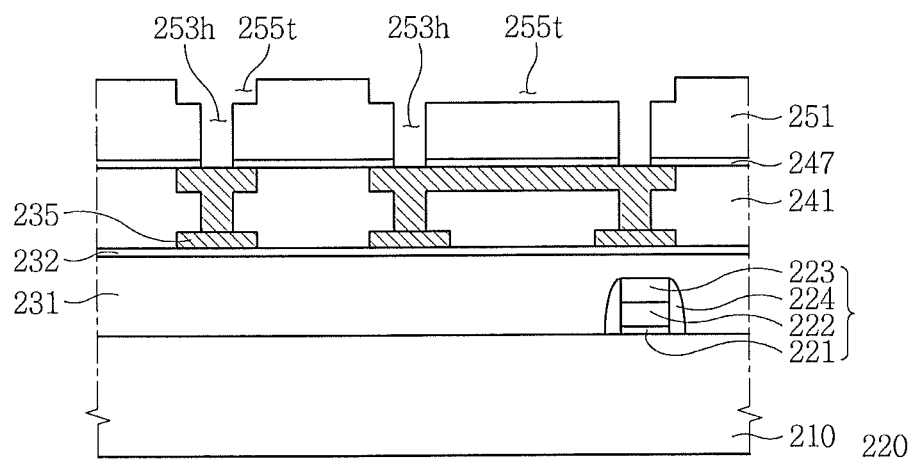

Referring to FIG. 3D, the method may include forming a second intermediate interlayer dielectric layer 251 on the first intermediate stopper layer 247, and forming second via holes 253h and second interconnection trenches 255t in the second intermediate interlayer dielectric layer 251. The second via holes 253h may expose parts of surfaces of the first interconnection plugs 245p. The second interconnection trenches 255t may overlap at least one of the second via holes 253h.

Figure 3E:
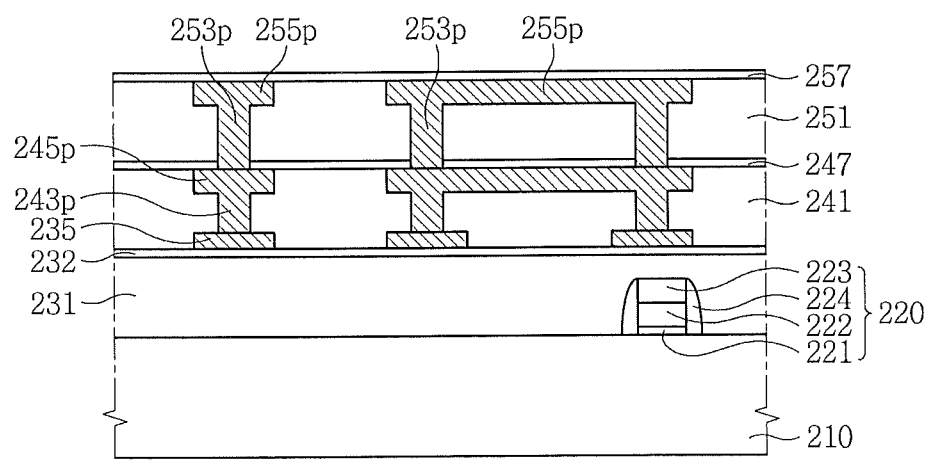

Referring to FIG. 3E, the method may include forming second via plugs 253p, second interconnection plugs 255p, and a second intermediate stopper layer 257. The second via plugs 253p may fill the second via holes 253h, and the second interconnection plugs 255p may fill the second interconnection trenches 255t. The second via plugs 253p and the second interconnection plugs 255p may be formed using a dual damascene process. Each of the second via plugs 253p and the second interconnection plugs 255p may include a barrier metal and a core metal. The second intermediate stopper layer 257 may include silicon nitride.

Figure 3F:
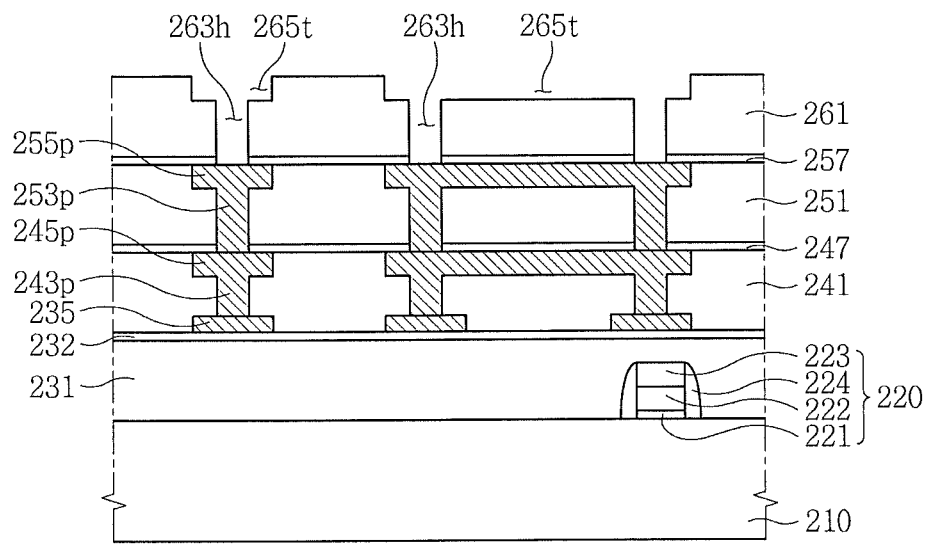

Referring to FIG. 3F, the method may include forming a third intermediate interlayer dielectric layer 261 on the second intermediate stopper layer 257, and forming third via holes 263h and third interconnection trenches 265t in the third intermediate interlayer dielectric layer 261. The third via holes 263h may expose parts of surfaces of the second interconnection plugs 255p. The third interconnection trenches 265t may overlap at least one of the third via holes 263h.

Figure 3G:
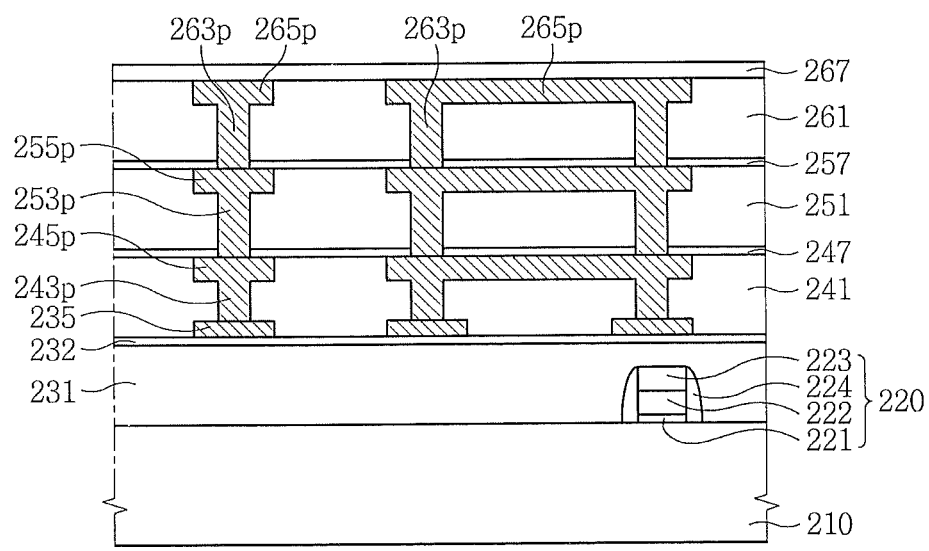

Referring to FIG. 3G, the method may include forming third via plugs 263p, third interconnection plugs 265p, and a passivation layer 267. The third via plugs 263p may fill the third via holes 263h, and the third interconnection plugs 265p may fill the third interconnection trenches 265t. The third via plugs 263p and the third interconnection plugs 265p may be formed using a dual damascene process. Each of the third via plugs 263p and the third interconnection plugs 265p may include a barrier metal and a core metal. The passivation layer 267 may include silicon nitride, silicon oxide, or a polyimide.

Referring to FIG. 1B again, the method may include forming a redistribution layer structure 270 on the passivation layer 267. The redistribution layer structure 270 may include a plug part 271 passing through the passivation layer 267 to be connected to the third interconnection plugs 265p, and a pad part 275 disposed on the passivation layer 267.

Figure 4A:
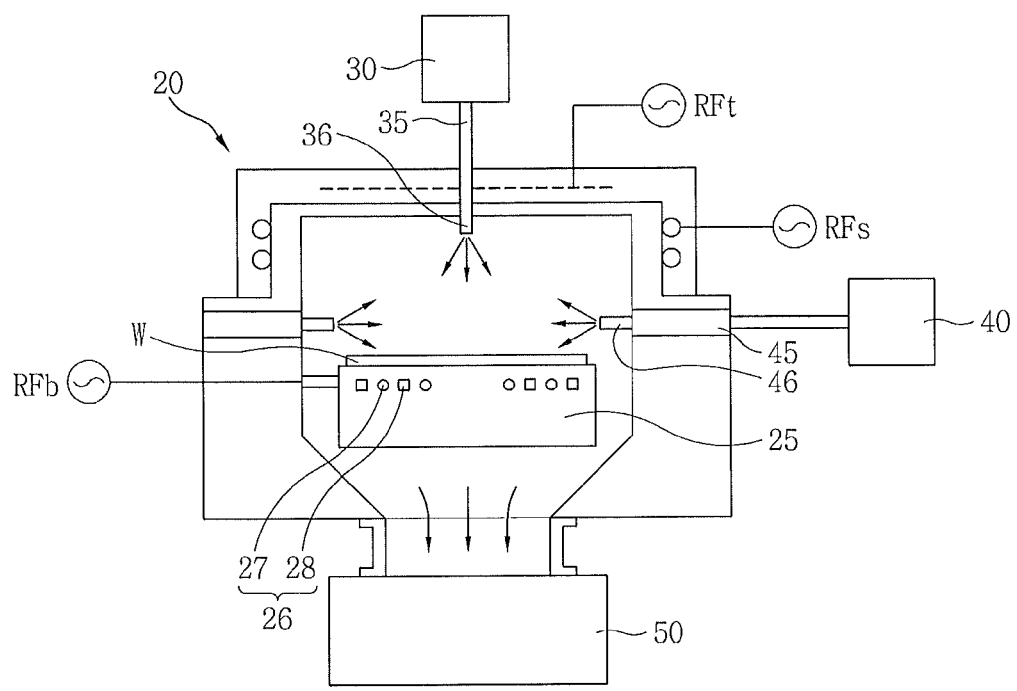
FIGS. 4A and 4B are diagrams illustrating a deposition apparatus according to some embodiments of the present inventive concept.

FIG. 4A is a diagram illustrating a deposition apparatus according to some embodiments of the present inventive concept. Referring to FIG. 4A, a deposition apparatus 10 may include a chamber 20, a radical supply 30, and a precursor supply 40.

The chamber 20 may include a mounter 25 configured to support a wafer W at a lower part therein. That is, the wafer W may be mounted on the mounter 25. The mounter 25 may include an electro-static chuck. The mounter 25 may include a temperature controller 26 therein. The temperature controller 26 may include a coil-type heater 27 for heating, and/or an air path 28 for cooling. An inert gas, such as helium, may cool down the mounter 25 through the air path 28. A top source RF electrode RFt may be disposed at an upper part of the chamber 20, a side RF electrode RFs may be disposed at an upper side part of the chamber 20, and a bias RF electrode RFb may be disposed at the mounter 25.

Oxygen radicals O* supplied from the radical supply 30 may be supplied to the inside of the chamber 20 through a radical supply pipe 35. A radical supply nozzle 36 configured to spray or atomize the oxygen radicals O* in the chamber 20 may be formed at an ending portion of the radical supply pipe 35. The radical supply nozzle 36 may be arranged at an upper center portion of the chamber 20.

Precursors supplied from the precursor supply 40 may be uniformly supplied to the inside of the chamber 20 through a precursor supply pipe 45 and a precursor supply nozzle 46. A plurality of the precursor supply nozzles 46 may be arranged in the chamber 20. The precursor supply nozzle 46 may have a shape of a horizontal rod protruding from a side of the chamber 20 toward the center of chamber 20. The precursor supply 40 may supply a carrier gas such as helium (He) and/or argon (Ar) together with organic silicon precursors. The carrier gas may transport the organic silicon precursors to the inside of the chamber 20.

The outlet 50 may discharge reaction gases from the inside of the chamber 20 to the outside of the chamber 20. The outlet 50 may include a vacuum pump such as a turbo pump.

Figure 4B:
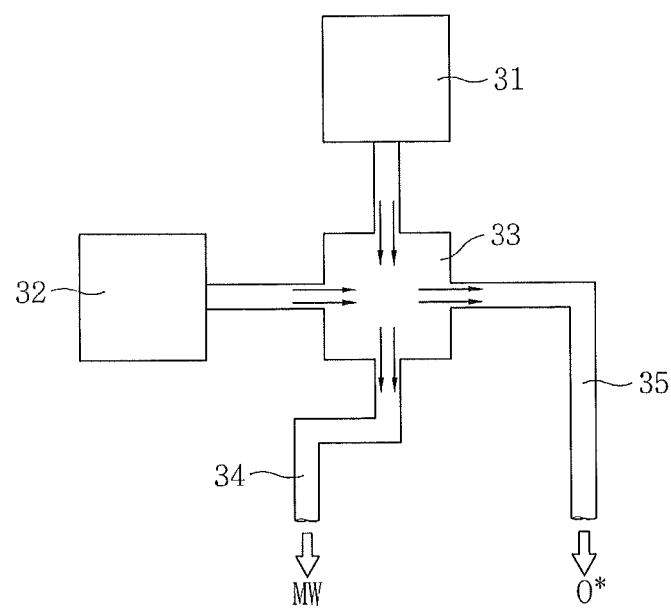

FIG. 4B is a diagram illustrating a radical supply of a deposition apparatus according to some embodiments of the present inventive concept. Referring to FIG. 4B, a radical supply 30 of the deposition apparatus 10 according to some embodiments of the present inventive concept may include a microwave generator 31, a gas supply 32, and a plasma generator 33. For example, the microwave generator 31 may generate microwaves (MW) having a frequency of about 2.45 GHz, and power of about 1.5 to about 3.8 Kw. The gas supply 32 may supply $O_2$, $N_2O$, $H_2O$, combinations thereof or other gas including oxygen to the plasma generator 33. The gas may be plasmarized to include oxygen radicals O* while passing through the plasma generator 33, and may be supplied to the inside of the chamber 20 through the radical supply pipe 35. The microwaves passing through the plasma generator 33 may be discharged through an exhaust waveguide 34.

In the deposition apparatus 10 according to some embodiments of the present inventive concept, a deposition process may be performed by preparing gas plasma, which is plasmarized to include the oxygen radicals O* outside the chamber 20, and precursors separately and supplying the gas plasma and the precursors into the chamber 20. Accordingly, the precursors may not be directly exposed to the plasma or the microwaves.

Figure 5A:
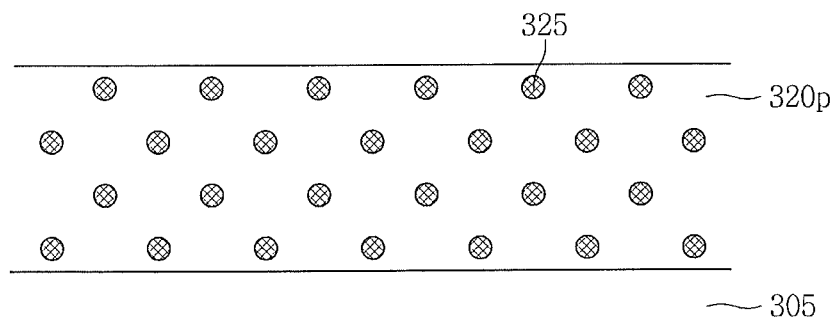
FIGS. 5A to 5C are diagrams illustrating a method of forming a dielectric layer according to some embodiments of the present inventive concept.
Figure 5B:
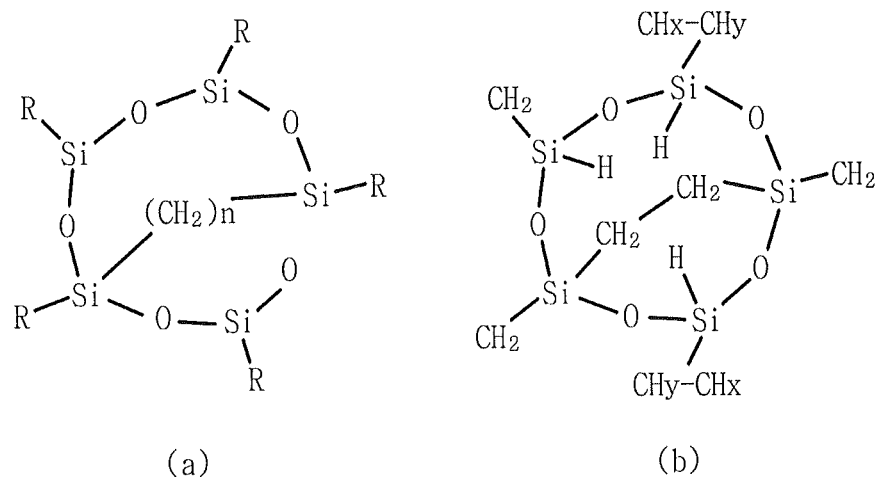
Figure 5C:
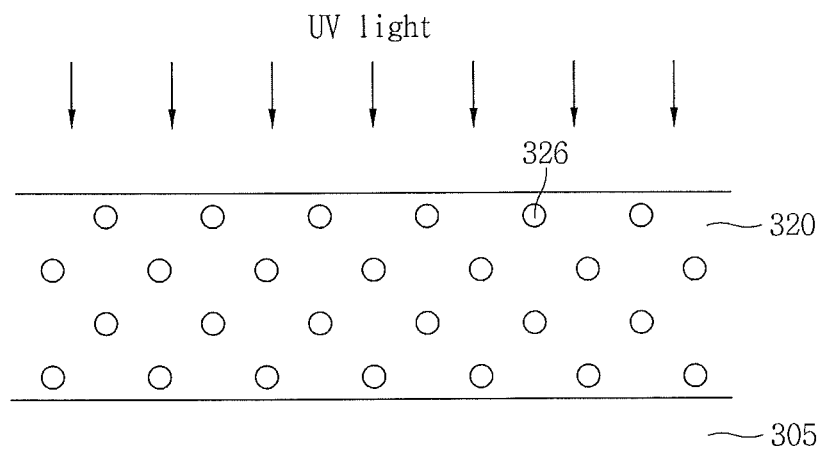

FIGS. 5A to 5C are diagrams illustrating a method of forming a dielectric layer according to some embodiments of the present inventive concept. The dielectric layer 320 may correspond to one of the lower interlayer dielectric layer 131, the intermediate interlayer dielectric layer 133, the upper interlayer dielectric layer 134, the lower interlayer dielectric layer 231, the first intermediate interlayer dielectric layer 241, the second intermediate interlayer dielectric layer 251, and the third intermediate interlayer dielectric layer 261 in the FIGS. 1A to 3G.

Referring to FIG. 5A, the method of forming the dielectric layer 320 according to some embodiments of the present inventive concept may include forming a preliminary dielectric layer 320p including porogens 325 on a lower layer 305. The lower layer 305 may include a silicon wafer, silicon nitride, silicon oxide, polysilicon, a metal, or a combination thereof.

Referring to FIGS. 4A and 4B again, the method may include introducing a wafer W into the chamber 20, vacuumizing the inside of the chamber 20, controlling and/or maintaining a temperature of the inside of the chamber 20 and/or the mounter 25 at an appropriate value, and supplying the oxygen radicals O* and the precursors including the porogens 325 to the chamber 20.

The oxygen radicals O* may be supplied in a plasma state including $O_2$, $N_2O$, $H_2O$, combinations thereof or other oxygen compound, or in a gas state which is not plasmarized. When the oxygen radicals O* are in the plasma state, the plasma may be formed outside the chamber 20, for example, formed using a remote plasma process. The plasma-state oxygen radicals O* may be formed and prepared outside the chamber 20 to be supplied to the inside of the chamber 20. Alternatively, the oxygen radicals O* may be excited by thermal energy and supplied without being accompanied by plasma.

The precursors may include organic silicon precursors. The precursors may include silicon atoms having a carbon bridge and the porogens 325. For example, the precursors may include a compound represented by Chemical formula 1 below.

[Chemical formula 1]

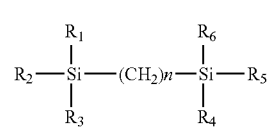

$R_1$ to $R_6$ are one of hydrogen, alkyl, and alkoxy, and n is an integer from 1 to 5. In some embodiments, alkyl is methyl. At least one of $R_1$ to $R_6$ may include the porogens 325. Accordingly, the preliminary dielectric layer 320p may include a carbon bridge having a —$(CH_2)n$- bonding structure in a network structure including a Si—O—Si bond.

In some embodiments, the precursors are the organic silicon precursors having a structure represented by Chemical formula 1.

As appreciated by the present inventors, the carbon bridge —$(CH_2)n$— may have a superior mechanical strength to the Si—O—Si— bond. Accordingly, the preliminary dielectric layer 320p may have relatively higher mechanical strength than a dielectric material having the Si—O—Si bond only. However, as also appreciated by the present inventors, the carbon bridge —$(CH_2)n$— may be vulnerable to a plasma or microwaves. Since the carbon bridge —$(CH_2)n$— of the preliminary dielectric layer 320p in the embodiments of the present inventive concept is not directly exposed to the plasma or microwaves, a Si—$(CH_2)n$-Si bonding structure may be maintained without being chemically and/or physically degraded and/or separated. Accordingly, the preliminary dielectric layer 320p in the embodiments of the present inventive concept may have sufficiently more Si—$(CH_2)n$-Si bonding structures than that formed using a plasma deposition process.

In some embodiments, the organic silicon precursors may include a silicon bond —Si-Cx-Si— of a separated carbon bridge, and a compound represented by Chemical formula 2 below.

[Chemical formula 2]

At least one of Ra, Rb, Rc, and Rd may be the porogens 325, and the others may be one of hydrogen, alkyl, and alkoxy. In some embodiments, alkyl is methyl.

In some embodiments, the precursors are the organic silicon precursors having a structure represented by Chemical formula 2.

For example, a process of forming the preliminary dielectric layer 320p may include controlling and/or maintaining the temperature of the mounter 25 at about −25° C. to 100° C., and maintaining the internal pressure of the chamber 20 at about 0.9 Torr to 5 Torr. In addition, the process may include supplying oxygen gas ($O_2$) including the oxygen radicals O* at about 1,500 to 3,000 standard-cubic-centimeters per minute (sccm) to the inside of the chamber 20, and the organic silicon precursors including the porogens 325 at about 50 to 500 miligrams per minute (mgm) to the inside of the chamber 20. Further referring to FIG. 4A, the organic silicon precursors may be mixed with the carrier gas in the precursor supply 40 and may be supplied together. The carrier gas may include an inert gas such as helium and argon. For example, helium gas may be supplied to the inside of the chamber 20 at about 1,000 to 3,000 sccm, and argon gas may be supplied to the inside of the chamber 20 at about 500 to 1,500 sccm. Alternatively, the helium gas and the argon gas may be supplied to the inside of the chamber 20 at the same time. The carrier gas may carry the organic silicon precursors to the inside of the chamber 20. In some embodiments, the process of forming the preliminary dielectric layer 320p may include maintaining the temperature of the mounter 25 at about 80° C. and the internal pressure of the chamber 20 at about 1.9 Torr, and supplying the oxygen gas ($O_2$) including the oxygen radicals O* at about 2,000 sccm, the organic silicon precursors including the porogens 325 at 600 mgm, and the carrier gas at 1,500 sccm, to the inside of the chamber 20.

As the temperature of the mounter 25 rises, the deposition rate of the preliminary dielectric layer 320p may decrease, flowability may be lowered, the carbon bridge may be damaged, and therefore, the amount of the carbon bridges in the preliminary dielectric layer 320p may be reduced. Accordingly, when the temperature of the mounter 25 rises above 100° C., since the flowability of the preliminary dielectric layer 320p is lowered, conformality and planarity of the preliminary dielectric layer 320p may be worse. In addition, since the amount of the carbon bridges in the preliminary dielectric layer 320p is reduced, the mechanical strength and/or physical endurance may be degraded. Accordingly, some embodiments may sufficiently provide the mechanical strength and/or physical endurance of the preliminary dielectric layer 320p without excessively degrading the deposition rate and flowability of the preliminary dielectric layer 320p.

As the internal pressure of the chamber 20 rises, the deposition rate of the preliminary dielectric layer 320p may decrease, however, flowability may increase, and the amount of the carbon bridges in the preliminary dielectric layer 320p may increase. Accordingly, the flowability of the preliminary dielectric layer 320p and the amount of the carbon bridges may be properly secured without excessively degrading the productivity, by maintaining an appropriate internal pressure of the chamber 20 as may be determined by one of ordinary skill in the art.

When the flow rate of the oxygen radicals O* increases, the deposition rate of the preliminary dielectric layer 320p may increase, however, the flowability of the preliminary dielectric layer 320p and the amount of the carbon bridges may decrease. Methods according to some embodiments may provide appropriate flowability of the preliminary dielectric layer 320p and the amount of the carbon bridges, and the deposition rate may be desirable.

In addition, the porogens 325 may include one of branched poly(p-xylene), linear poly(p-phenylene), linear polybutadiene, branched polyethylene, poly(ethylene terephthalate) (PET), polyamide-6,6 (Nylon 6/6), syndiotactic polystyrene (PS-syn), polycaprolactone (PCL), poly(propylene oxide) (PPO), polycarbonates, poly(phenylene sulfide) (PPS), polyamideimide (PAI), polyphthalamide (PPA) such as Amodel, polymethylstyrene (PMS), polyetheretherketone (PEEK), poly(ether sulfone) (PES), poly(etherketone) (PEK), polyoxymethylene (POM), poly(butylene terephthalate) (PBT), polystyrene (PS), poly(norbornene), cetyltrimethylammonium bromide (CTAB), poly(ethylene oxide-b-propylene oxide-b-ethylene oxide) (PEO-b-PPO-b-PEO), and cyclodextrin (CD).

For example, the porogens 325 may include at least one of various hydrocarbons represented by Chemical formulas 3 to 9 below.

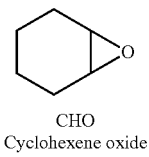

[Chemical formula 3]

CHO
Cyclohexene oxide

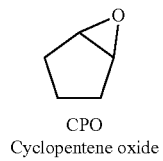

[Chemical formula 4]

CPO
Cyclopentene oxide

-continued

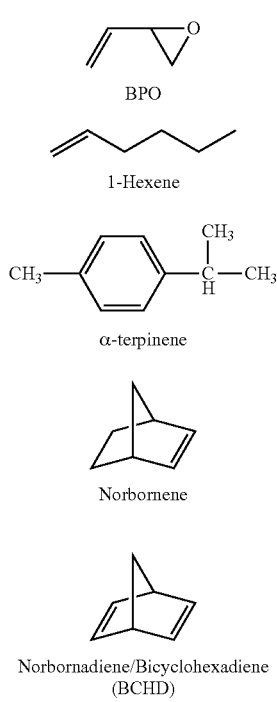

[Chemical formula 5]
BPO

[Chemical formula 6]
1-Hexene

[Chemical formula 7]
α-terpinene

[Chemical formula 8]
Norbornene

[Chemical formula 9]
Norbornadiene/Bicyclohexadiene (BCHD)

Referring to FIG. 5B, the preliminary dielectric layer 320p may include SiCHO—R oligomer. The SiCHO—R oligomer may include an R—Si—(CH$_2$)n-Si—R bond. Here, R may include the porogens 325 having carbon bridges of —CHx-CHy-, —H, —OH, —CH$_3$, or alkyls having other various C, H, and O. Various types of SiCHO—R oligomers are exemplarily shown in (a) and (b).

Referring to FIG. 5C, the method of forming the dielectric layer 320 may include changing the preliminary dielectric layer 320p to a porous dielectric layer 320 using a curing process. The curing process may include one of an ultra violet (UV) light irradiation process, an e-beam irradiation process, and/or a heat treatment process. When the curing process includes the UV light irradiation process, the UV light may include a multi-colored light with a plurality of wavelengths of 200 nm or more. By the curing process, the porogens 325 may be removed. Pores 326 may be formed where the porogens 325 are removed.

According to the present inventive concept, since the oxygen radicals O* are plasmarized outside the chamber and then supplied to the chamber, carbon bridges —(CH$_2$)n- of the precursors may not be directly exposed to plasma that generates the oxygen radicals O*. For example, the carbon bridges —(CH$_2$)n- may not be exposed to the microwaves. Since the carbon bridges —(CH$_2$)n- are so vulnerable to plasma and/or microwaves to be easily separated, the preliminary dielectric layer 320p and the dielectric layer 320 formed by methods according to some embodiments may have more carbon bridges —(CH$_2$)n- than that formed using plasma in the chamber. A —Si—(CH$_2$)n-Si— bonding structure may have superior physical endurance and/or mechanical strength to a —Si—O—Si— bonding structure, and therefore may be useful in a process of manufacturing a semiconductor device.

Figure 6A:
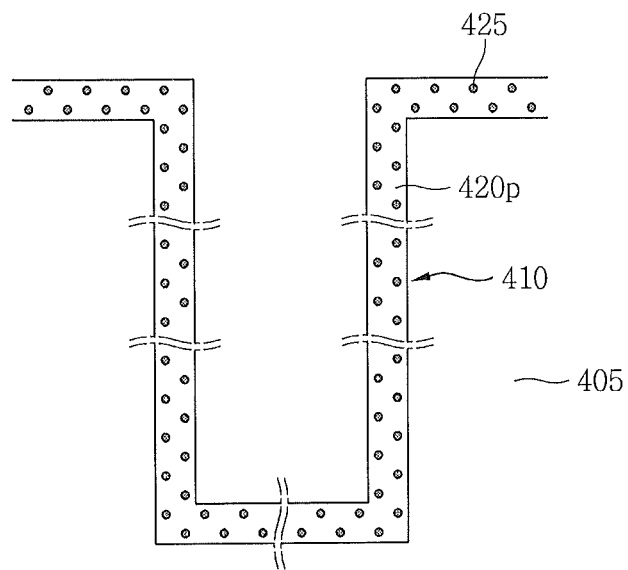
FIGS. 6A to 6C are cross-sectional views illustrating a method of forming a via plug structure 400 or a semiconductor device having the via plug structure 400 according to some embodiments of the present inventive concept.
Figure 6B:
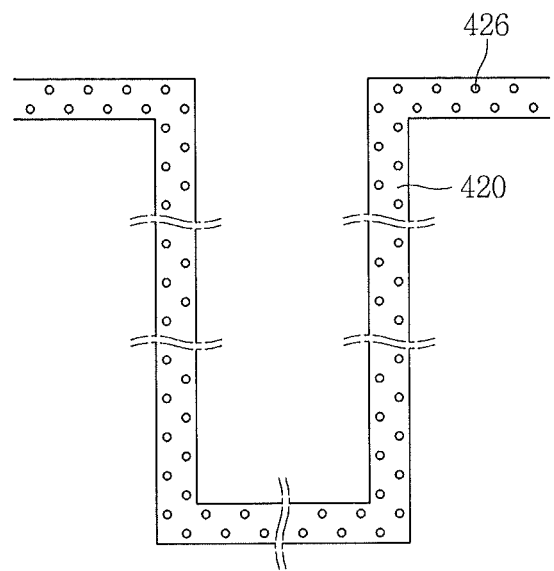
Figure 6C:
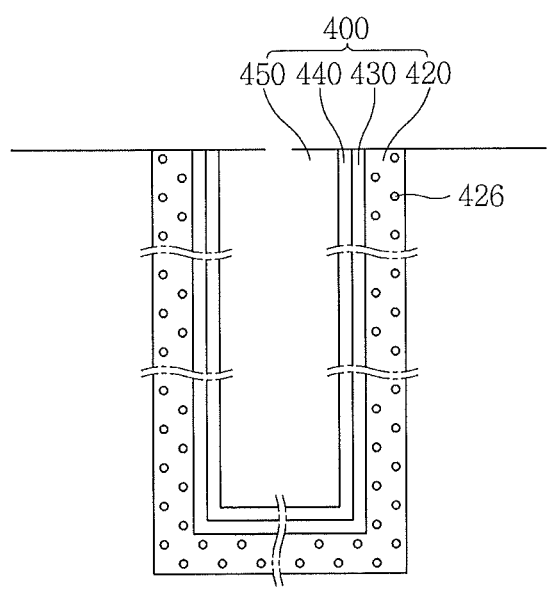

FIGS. 6A to 6C are cross-sectional views illustrating a method of forming a via plug structure 400 or a semiconductor device having the via plug structure 400 according to some embodiments of the present inventive concept. The via plug structure 400 may include the via plug structure 140 shown in FIG. 1A and FIG. 2A through 2K.

Referring to FIG. 6A, the method of forming the via plug structure 400 or the semiconductor device including the via plug structure 400 may include forming a via hole 410 in the lower layer 405, and forming a preliminary via dielectric layer 420p on a surface of the lower layer 405 and an inner wall of the via hole 410. The preliminary via dielectric layer 420p may include a plurality of porogens 425. The formation of the preliminary via dielectric layer 420p may be similar to those explained with reference to FIG. 5A.

Referring to FIG. 6B, the method may include changing the preliminary via dielectric layer 420p to a porous via dielectric layer 420 by performing a curing process. The curing process may include one of an ultra violet (UV) light irradiation process, an e-beam irradiation process, and a heat treatment process. When the curing process includes the UV light irradiation process, the UV light may include a multi-colored light having a plurality of wavelengths of more than 200 nm. The porogens 425 may be removed by the curing process. Pores 426 may be formed where the porogens 425 are removed.

Referring to FIG. 6C, the method may include forming a via barrier layer 430 on the via dielectric layer 420, forming a via seed layer 440 on the via barrier layer 430, forming a via plug 450 on the via seed layer 440, and forming a via plug structure 400 by performing a planarization process such as a CMP process.

For example, the via barrier layer 430 may include a barrier metal, such as Ti, TiN, Ta, and TaN, and the via seed layer 440 and the via plug 450 may include Cu. When the via seed layer 440 and the via plug 450 include the same metal, a boundary therebetween may be less visible. An upper surface of the lower layer 405 may be exposed by the planarization process.

Figure 7A:
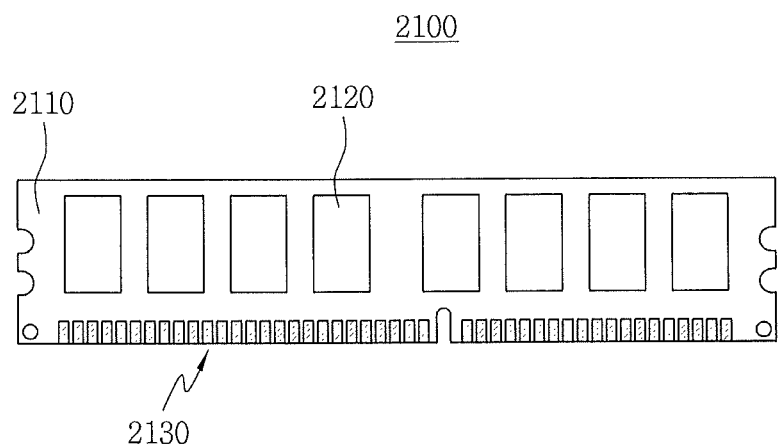
FIG. 7A is a diagram of a memory module 2100 according to some embodiments of the present inventive concept.

FIG. 7A is a diagram of a memory module 2100 according to some embodiments of the present inventive concept. Referring to FIG. 7A, the memory module 2100 may include a memory module substrate 2110, a plurality of memory devices 2120 and terminals 2130 disposed on the memory module substrate 2110. The memory module substrate 2110 may include a printed circuit board or a wafer. The memory devices 2120 may include a semiconductor device having a low-k dielectric layer according to various embodiments of the present inventive concept, or a semiconductor package including the semiconductor device having the low-k dielectric layer. The plurality of terminals 2130 may include a conductive metal. Each terminal 2130 may be electrically connected to each memory device 2120. Since the memory module 2100 includes a semiconductor device having low leakage current and excellent on/off characteristics, module performance may be improved.

Figure 7B:
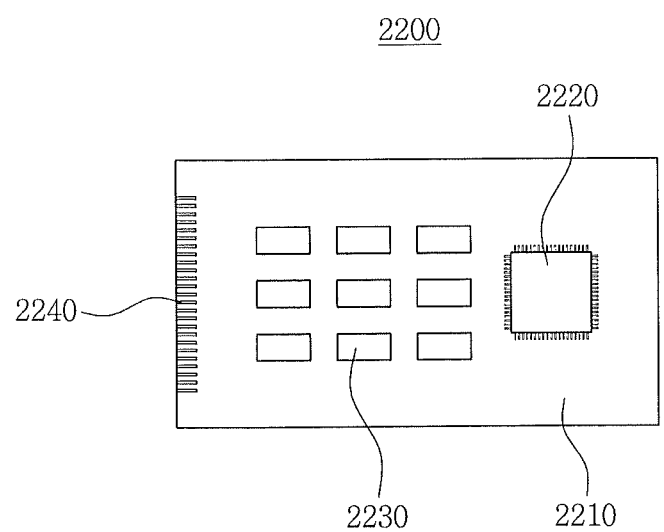
FIG. 7B is a diagram of a memory card 2200 according to some embodiments of the present inventive concept.

FIG. 7B is a diagram of a memory card 2200 according to some embodiments of the present inventive concept. Referring to FIG. 7B, the memory card 2200 may include a semiconductor device having a low-k dielectric layer according to various embodiments of the present inventive concept mounted on a memory card board 2210. The memory card 2200 may further include a microprocessor 2220 mounted on the memory card board 2210. Input/output terminals 2240 may be disposed on at least one side of the memory card board 2210.

Figure 7C:
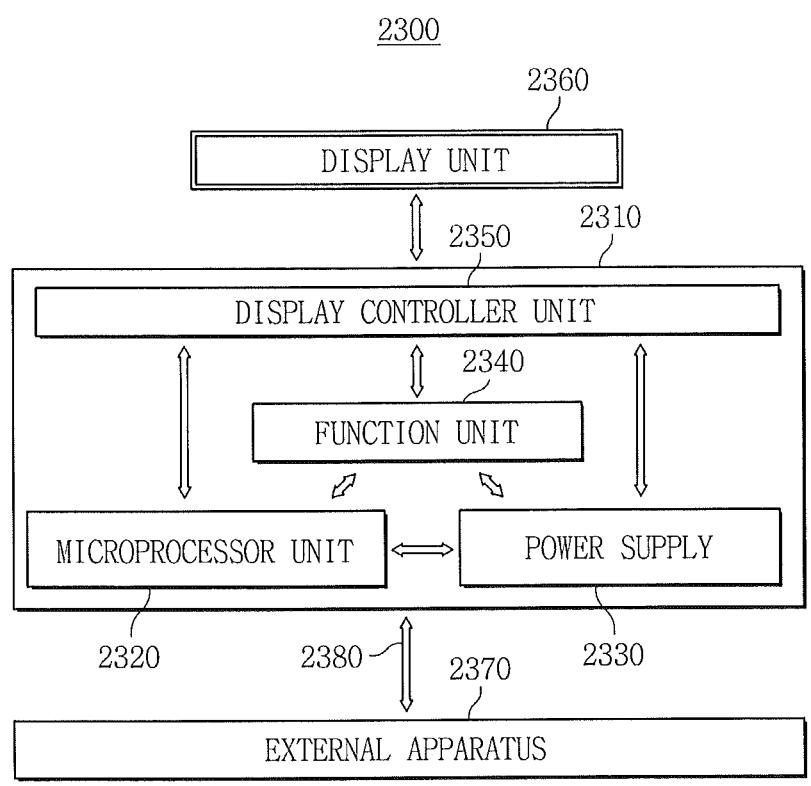
FIG. 7C is a block diagram of an electronic system 2300 according to some embodiments of the present inventive concept.

FIG. 7C is a block diagram of an electronic system 2300 according to some embodiments of the present inventive concept. Referring to FIG. 7C, the semiconductor device having a low-k dielectric layer according to various embodiments of the present inventive concept may be included in the electronic system 2300. The electronic system 2300 may include a body 2310. The body 2310 may include a microprocessor unit 2320, a power supply 2330, a function unit 2340, and/or a display controller unit 2350. The body 2310 may be a system board or mother board including, for example, a printed circuit board (PCB). The microprocessor unit 2320, the power supply 2330, the function unit 2340, and the display controller unit 2350 may be mounted or installed on the body 2310. A display unit 2360 may be arranged on a top surface or outside of the body 2310. For example, the display unit 2360 may be arranged on a surface of the body 2310 and display an image processed by the display controller unit 2350.

The power supply 2330 may receive a constant voltage from, for example, an external power source and may divide the voltage into various levels or may supply those voltages to the microprocessor unit 2320, the function unit 2340, the display controller unit 2350, etc. The microprocessor unit 2320 may receive a voltage from the power supply 2330 to control the function unit 2340 and the display unit 2360. The function unit 2340 may perform various functions of the electronic system 2300. For example, if the electronic system 2300 is a mobile electronic apparatus such as a mobile phone, the function unit 2340 may have several components which can perform functions of wireless communication such as image output to the display unit 2360 and/or sound output to a speaker through dialing or communication with an external apparatus 2370, and if a camera is installed, the function unit 2340 may serve as an image processor.

In some embodiments, when the electronic system 2300 is connected to, for example, a memory card in order to increase storage capacity, the function unit 2340 may be a memory card controller. The function unit 2340 may communicate signals with the external apparatus 2370 through a wired or wireless communication unit 2380. In addition, when the electronic system 2300 needs a universal serial bus (USB) etc. in order to expand functions thereof, the function unit 2340 may serve as an interface controller. The semiconductor device having a low-k dielectric layer described in various embodiments according to the present inventive concept may be included in at least one of the microprocessor unit 2320 and the function unit 2340.

Figure 7D:
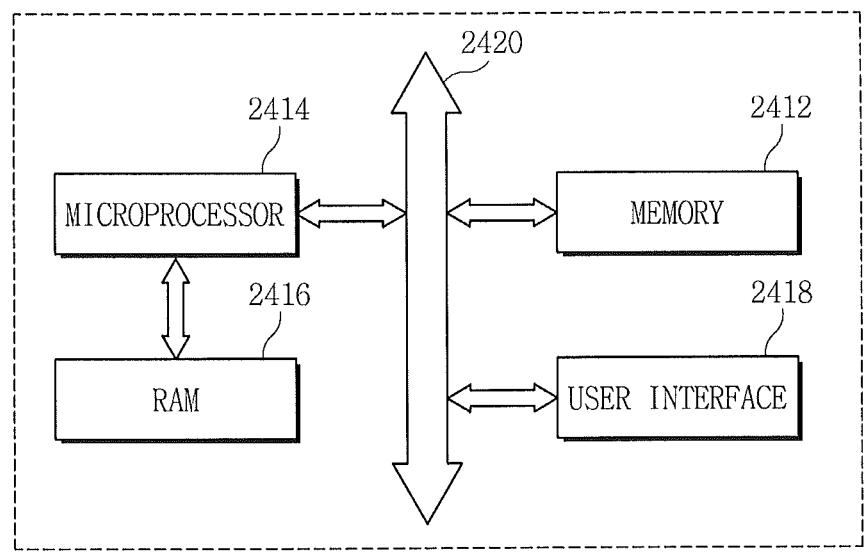
FIG. 7D is a block diagram of an electronic system 2400 according to some embodiments of the present inventive concept.

FIG. 7D is a block diagram of an electronic system 2400 according to some embodiments of the present inventive concept. Referring to FIG. 7D, the electronic system 2300 may include the semiconductor device having a low-k dielectric layer according to various embodiments of the present inventive concept. The electronic system 2400 may be included in a mobile apparatus or a computer. For example, the electronic system 2400 may include a memory system 2412, a microprocessor 2414 performing data communication using a bus 2420, a random access memory (RAM) 2416, and a user interface 2418. The microprocessor 2414 may program and control the electronic system 2400. The RAM 2416 may be used as an operation memory of the microprocessor 2414. For example, the microprocessor 2414 or the RAM 2416 may include a semiconductor device having a low-k dielectric layer according to various embodiments of the present inventive concept. The microprocessor 2414, the RAM 2416, and/or other components may be assembled in a single package. The user interface 2418 may be used to input data to, or output data from the electronic system 2400. The memory 2412 may store codes for operating the microprocessor 2414, data processed by the microprocessor 2414, or external input data. The memory 2412 may include a controller and a memory device.

Figure 7E:
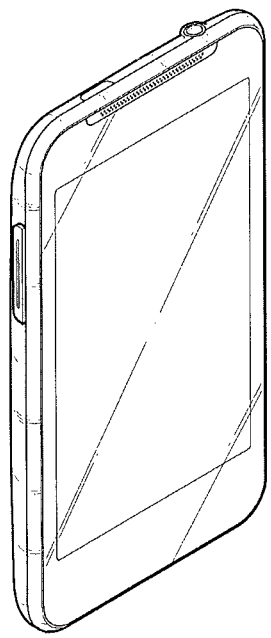
FIG. 7E is a perspective view of a mobile wireless phone 2500 according to some embodiments of the present inventive concept.

FIG. 7E is a perspective view of a mobile wireless phone 2500 according to some embodiments of the present inventive concept. In some embodiments, the mobile wireless phone 2500 may be a tablet PC. In addition, the semiconductor device having a low-k dielectric layer according to various embodiments of the present inventive concept may be used in a portable computer such as a notebook, an MPEG-1 Audio Layer 3 (MP3) player, an MP4 player, a navigation apparatus, a solid state disk (SSD), a desktop computer, an automobile, or a home appliance, as well as a tablet PC.

A semiconductor device having a low-k dielectric layer according to various embodiments of the present inventive concept may include a dielectric layer having improved physical endurance and/or mechanical strength. Accordingly, the process of fabricating a semiconductor device may be stabilized, and productivity and/or yield may be improved. In addition, since physical and/or mechanical characteristics are improved, lifecycle of a semiconductor device may increase.

The above-disclosed subject matter is to be considered illustrative, and not restrictive, and the appended claims are intended to cover all such modifications, enhancements, and other embodiments, which fall within the true spirit and scope of the present inventive concept. Thus, to the maximum extent allowed by law, the scope is to be determined by the broadest permissible interpretation of the following claims and their equivalents, and shall not be restricted or limited by the foregoing detailed description.

What is claimed is:

1. A method of forming a semiconductor device, comprising:
    introducing a plasma and organic silicon precursors into a chamber to form a preliminary dielectric layer on a wafer, wherein the plasma comprises oxygen radicals generated from an external plasma generator that is outside the chamber, the organic silicon precursors comprise carbon bridges and porogens, and the preliminary dielectric layer comprises the porogens; and
    forming a porous dielectric layer by removing at least some of the porogens from the preliminary dielectric layer, wherein the plasma is vertically introduced into the chamber and the organic silicon precursors are horizontally introduced into the chamber separately from the plasma, and the oxygen radicals and the organic silicon precursors react with each other in the chamber,
    wherein the organic silicon precursors comprise a compound represented by one of the following chemical formulas:

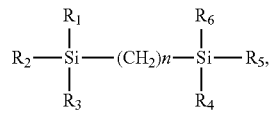

wherein each of $R_1$, $R_2$, $R_3$, $R_4$, $R_5$, and $R_6$ is one of hydrogen, alkyl, and alkoxy, n is an integer of 1 to 5, and at least one of $R_1$, $R_2$, $R_3$, $R_4$, $R_5$ and $R_6$ comprises one of the porogens, and

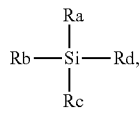

wherein each of Ra, Rb, Rc, and Rd is one of hydrogen, alkyl, and alkoxy, and at least one of Ra, Rb, Rc, and Rd comprises one of the porogens.

2. The method of claim 1, wherein:
the external plasma generator includes a microwave generator configured to generate microwaves and a gas supply configured to supply a gas comprising oxygen, and the plasma is generated by passing the gas comprising oxygen through the microwaves generated from the microwave generator.

3. The method of claim 1, wherein the porogens comprise a —CHx-CHy- bonding structure.

4. The method of claim 1, wherein the organic silicon precursors are mixed with a carrier gas to be introduced into the chamber.

5. The method of claim 4, wherein the organic silicon precursors are supplied at a flow rate of about 50 milligrams per minute (mg/min) to about 500 mg/min.

6. The method of claim 1, further comprising:
loading the wafer onto a mounter in the chamber; and
controlling a temperature of the mounter at a range of about −25° C. to about 100° C.

7. The method of claim 1, further comprising:
maintaining an internal pressure of the chamber at a range of about 0.9 Torr to about 5 Torr.

8. The method of claim 1, wherein removing the porogens comprises irradiating UV light.

9. The method of claim 1, wherein:
the oxygen radicals are introduced from an upper portion of the chamber; and
the organic silicon precursors are introduced through a tubular nozzle protruding from a side of the chamber.

10. A method of forming a semiconductor device, comprising:
forming a via hole in a lower layer formed on a substrate;
forming a preliminary via dielectric layer comprising porogens on an upper surface of the lower layer and an inner wall of the via hole;
converting the preliminary via dielectric layer into a porous via dielectric layer by performing a curing process to remove the porogens; and
forming a via plug filling the via hole on the porous via dielectric layer,
wherein forming the preliminary via dielectric layer comprises introducing plasma and organic silicon precursors comprising carbon bridges and the porogens into a chamber,
the plasma comprises oxygen radicals generated from an external plasma generator that is outside the chamber, and
the plasma is vertically introduced into the chamber and the organic silicon precursors are horizontally introduced into the chamber separately from the plasma, and the oxygen radicals and the organic silicon precursors react with each other in the chamber,
wherein the organic silicon precursors comprise a compound represented by one of the following chemical formulas:

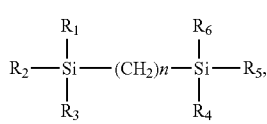

wherein each of $R_1$, $R_2$, $R_3$, $R_4$, $R_5$ and $R_6$ is one of hydrogen, alkyl, and alkoxy, n is an integer of 1 to 5 and at least one of $R_1$, $R_2$, $R_3$, $R_4$, $R_5$ and $R_6$ comprises one of the porogens, and

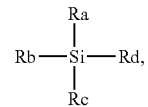

wherein each of Ra, Rb, Rc, and Rd is one of hydrogen, alkyl, and alkoxy, and at least one of Ra, Rb, Rc, and Rd comprises one of the porogens.

11. The method of claim 10, further comprising:
forming a transistor on the substrate and forming a lower interlayer dielectric layer covering the transistor on the substrate,
wherein the lower layer comprises the lower interlayer dielectric layer and the via hole vertically passes through the lower interlayer dielectric layer and the substrate.

12. A method of forming a dielectric layer, comprising:
introducing oxygen radicals and organic silicon precursors into a chamber to form a preliminary dielectric layer on a substrate, wherein each of the organic silicon precursors comprises a carbon bridge and a porogen such that the preliminary dielectric layer comprises carbon bridges and porogens;
removing at least some of the porogens from the preliminary dielectric layer to form a porous dielectric layer comprising the carbon bridges, wherein the organic silicon precursors comprise a compound having the following structure:

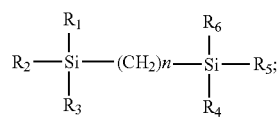

wherein each of $R_1$, $R_2$, $R_3$, $R_4$, $R_5$ and $R_6$ is one of hydrogen, alkyl, and alkoxy;
n is an integer of 1 to 5; and
at least one of $R_1$, $R_2$, $R_3$, $R_4$, $R_5$ and $R_6$ comprises one of the porogens.

13. The method of forming the dielectric layer of claim 12, wherein the oxygen radicals are generated outside the chamber.

14. The method of forming the dielectric layer of claim 12, wherein removing at least some of the porogens comprises irradiating UV light.

15. The method of forming the dielectric layer of claim 12, wherein the oxygen radicals and the organic silicon precursors are introduced into the chamber separately to react with each other in the chamber.

16. The method of forming the dielectric layer of claim 15, wherein:
the oxygen radicals are introduced from an upper portion of the chamber; and
the organic silicon precursors are introduced through a nozzle protruding from a side of the chamber.

* * * * *